(12) United States Patent
Kim

(10) Patent No.: US 12,406,620 B2
(45) Date of Patent: Sep. 2, 2025

(54) DISPLAY DEVICE

(71) Applicant: Samsung Display Co., Ltd., Yongin-Si (KR)

(72) Inventor: Keun Woo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/974,589

(22) Filed: Oct. 27, 2022

(65) Prior Publication Data

US 2023/0206841 A1   Jun. 29, 2023

(30) Foreign Application Priority Data

Dec. 23, 2021   (KR) .......................... 10-2021-0186024

(51) Int. Cl.
  *G09G 3/3233*   (2016.01)
  *H10K 59/131*   (2023.01)
  *H10K 71/00*   (2023.01)
  *H10K 59/12*   (2023.01)

(52) U.S. Cl.
  CPC ......... *G09G 3/3233* (2013.01); *H10K 59/131* (2023.02); *H10K 71/00* (2023.02); *G09G 2300/0819* (2013.01); *G09G 2300/0842* (2013.01); *G09G 2310/08* (2013.01); *G09G 2320/0247* (2013.01); *H10K 59/1201* (2023.02)

(58) Field of Classification Search
  CPC ......... G09G 3/3233; G09G 2300/0426; G09G 2300/0819; G09G 2300/0842; G09G 2300/0861; G09G 2310/08; G09G 2320/0247; H10K 59/121; H10K 59/1213; H10K 59/131; H10K 71/00; H10K 59/1201
  See application file for complete search history.

(56) References Cited

U.S. PATENT DOCUMENTS 4,954,855 A * 9/1990 Mimura ................ H01L 29/456
                                                              257/E29.147
7,714,387 B2 * 5/2010 Shiota ............... H01L 29/78621
                                                              257/E29.147

(Continued)

FOREIGN PATENT DOCUMENTS

CN       113363290 A      9/2021
JP       2013-225551 A   10/2013

(Continued)

*Primary Examiner* — Stacy Khoo
(74) *Attorney, Agent, or Firm* — Innovation Counsel LLP

(57) ABSTRACT

An embodiment provides a display device including: a substrate; a plurality of transistors disposed on the substrate, each of the plurality of transistors including a semiconductor layer disposed on the substrate, and a gate electrode disposed on the semiconductor layer; and a light emitting element positioned on the data conductor layer, wherein the plurality of transistors include a driving transistor that transmits a driving voltage to the light emitting element and a compensation transistor that is turned on in response to a scan signal, the semiconductor layer includes a first portion having a first thickness and a second portion having a second thickness thinner than the first thickness, and the driving transistor is disposed in the first portion of the semiconductor layer.

32 Claims, 43 Drawing Sheets

(56) References Cited

U.S. PATENT DOCUMENTS

| | | | |
|---|---|---|---|
| 2010/0289081 A1* | 11/2010 | Griebenow | H01L 21/84 257/E21.632 |
| 2016/0126457 A1 | 5/2016 | Jeon et al. | |
| 2020/0365677 A1* | 11/2020 | Yun | H10K 59/1213 |
| 2020/0373431 A1 | 11/2020 | Ohta | |
| 2021/0280652 A1 | 9/2021 | Kim et al. | |
| 2021/0280659 A1* | 9/2021 | Park | G09G 3/3233 |

FOREIGN PATENT DOCUMENTS

| | | |
|---|---|---|
| KR | 10-2005-0081227 A | 8/2005 |
| KR | 10-2016-0053318 A | 5/2016 |
| KR | 10-2019-0072164 A | 6/2019 |
| KR | 10-2020-0133118 A | 11/2020 |
| KR | 10-2021-0014815 A | 2/2021 |
| KR | 10-2021-0113513 A | 9/2021 |

\* cited by examiner

DISPLAY DEVICE

CROSS-REFERENCE TO RELATED APPLICATION

This application claims priority to and the benefit of Korean Patent Application No. 10-2021-0186024 filed in the Korean Intellectual Property Office on Dec. 23, 2021, the entire contents of which are incorporated herein by reference.

BACKGROUND

(a) Field

The present disclosure relates to a display device.

(b) Description of the Related Art

Recently, an organic light emitting diode display, which is one of light emitting display devices, has attracted attention as a device for displaying an image.

Since the light emitting diode display has a self-emission characteristic and does not require an additional light source unlike a liquid crystal display device, it is possible to reduce thickness and weight thereof. Further, the light emitting diode display has high-quality characteristics such as low power consumption, high luminance, and high response speed.

Generally, the light emitting diode display includes a substrate, a plurality of thin film transistors positioned on the substrate, a plurality of insulating layers disposed between wires included in the thin film transistors, and an organic light emitting diode connected to the thin film transistors.

The light emitting diode display includes a plurality of pixels, and each pixel includes a plurality of transistors. The transistor includes a polycrystalline semiconductor. In order to form the polycrystalline semiconductor, an amorphous semiconductor is subjected to a crystallization process through heat treatment by a laser or the like.

The above information disclosed in this Background section is only for enhancement of understanding of the background of the inventive concept, and therefore it may contain information that does not form the prior art that is already known in this country to a person of ordinary skill in the art.

SUMMARY

Embodiments are to provide a display device in which a flicker is not viewed when driven at a low frequency in a display device including a polycrystalline semiconductor, and a manufacturing method thereof.

An embodiment provides a display device including: a substrate; a plurality of transistors disposed on the substrate, each of the plurality of transistors including a semiconductor layer disposed on the substrate and a gate electrode disposed on the semiconductor layer; and a light emitting element disposed on the plurality of transistors, wherein the plurality of transistors include a driving transistor that transmits a driving voltage to the light emitting element and a compensation transistor that is turned on in response to a scan signal, the semiconductor layer includes a first portion having a first thickness and a second portion having a second thickness thinner than the first thickness, and the driving transistor is disposed in the first portion of the semiconductor layer.

A thickness of the first portion may be 400 Å to 500 Å.

A thickness of the second portion may be 300 Å to 400 Å.

The thickness of the second portion may be 60% to 90% of the thickness of the first portion.

A first electrode of the third transistor may be connected to a first electrode of the driving transistor; a second electrode of the third transistor may be connected to a gate electrode of the driving transistor; and the second portion of the semiconductor layer may be disposed between the second electrode of the third transistor and the gate electrode of the driving transistor.

The third transistor may include a (3-1)-th transistor and a (3-2)-th transistor serially connected to each other; and the second portion of the semiconductor layer may be disposed between the (3-1)-th transistor and the (3-2)-th transistor.

The third transistor may include a (3-1)-th transistor and a (3-2)-th transistor serially connected to each other; the (3-2)-th transistor may include the first portion of the semiconductor layer; and the (3-1)-th transistor may include the second portion of the semiconductor layer.

The third transistor may include the second portion of the semiconductor layer.

The plurality of transistors may further include a fourth transistor that transmits an initializing voltage to a gate of the driving transistor; a first electrode of the fourth transistor may be connected to an initializing voltage line; and a second electrode of the fourth transistor may be connected to the gate electrode of the driving transistor.

The second portion of the semiconductor layer may be disposed between the second electrode of the fourth transistor and the gate electrode of the driving transistor.

The fourth transistor may include a (4-1)-th transistor and a (4-2)-th transistor serially connected to each other; and the second portion of the semiconductor layer may be disposed between the (4-1)-th transistor and the (4-2)-th transistor.

The fourth transistor may include a (4-1)-th transistor and a (4-2)-th transistor serially connected to each other; the (4-2)-th transistor may include the first portion of the semiconductor layer; and the (4-1)-th transistor may include the second portion of the semiconductor layer.

The fourth transistor may include the second portion of the semiconductor layer.

The display device may include seven transistors and one capacitor.

The display device may include nine transistors and two capacitors.

One of the two capacitors may be a storage capacitor; the gate electrode of the driving transistor may be connected to a second electrode of the storage capacitor; and a first electrode of the storage capacitor may be connected to a second transistor through which a data voltage is applied and a fifth transistor through which a reference voltage is applied.

The second portion of the semiconductor layer may be disposed between a second electrode of the fifth transistor and the first electrode of the storage capacitor.

The fifth transistor may include a (5-1)-th transistor and a (5-2)-th transistor serially connected to each other; and the second portion of the semiconductor layer may be disposed between the (5-1)-th transistor and the (5-2)-th transistor.

The fifth transistor may include a (5-1)-th transistor and a (5-2)-th transistor serially connected to each other; the (5-2)-th transistor may include the first portion of the semiconductor layer; and the (5-1)-th transistor may include the second portion of the semiconductor layer.

The fifth transistor may include the second portion of the semiconductor layer.

The second portion of the semiconductor layer may be disposed between a second electrode of the second transistor and the first electrode of the storage capacitor.

The second transistor may include a (2-1)-th transistor and a (2-2)-th transistor serially connected to each other; and the second portion of the semiconductor layer may be disposed between the (2-1)-th transistor and the (2-2)-th transistor.

The fifth transistor may include a (2-1)-th transistor and a (2-2)-th transistor serially connected to each other; the (2-1)-th transistor may include the first portion of the semiconductor layer; and the (2-2)-th transistor may include the second portion of the semiconductor layer.

The second transistor may be disposed in the second portion of the semiconductor layer.

The semiconductor layer may be a polycrystalline semiconductor layer.

The display device may be driven even at a low frequency of less than 60 Hz.

Another embodiment provides a manufacturing method of a display device, including: forming an amorphous silicon layer on a substrate; crystallizing the amorphous silicon layer to form a polycrystalline silicon layer; doping the polycrystalline silicon layer to form a polycrystalline semiconductor layer; positioning a photoresist in a partial area of the polycrystalline semiconductor layer; and etching the polycrystalline semiconductor layer exposed by the photoresist to form a first portion having a first thickness and a second portion having a second thickness thinner than the first thickness.

The first portion may be an area overlapping the photoresist; and the second portion may be an area that does not overlap the photoresist.

A thickness of the first portion may be 400 Å to 500 Å.

A thickness of the second portion may be 300 Å to 400 Å.

In the etching of the polycrystalline semiconductor layer on which the photoresist is disposed, an etched thickness may be 10% to 40% of an entire thickness of the polycrystalline semiconductor layer.

The polycrystalline semiconductor layer may constitute an active layer of each of a plurality of transistors; and a driving transistor may include the first portion.

According to the embodiments, it is possible to provide a display device and a manufacturing method thereof in which a flicker is not viewed when driven at a low frequency in a display device including a polycrystalline semiconductor.

DETAILED DESCRIPTION OF THE EMBODIMENTS

Figure 1:
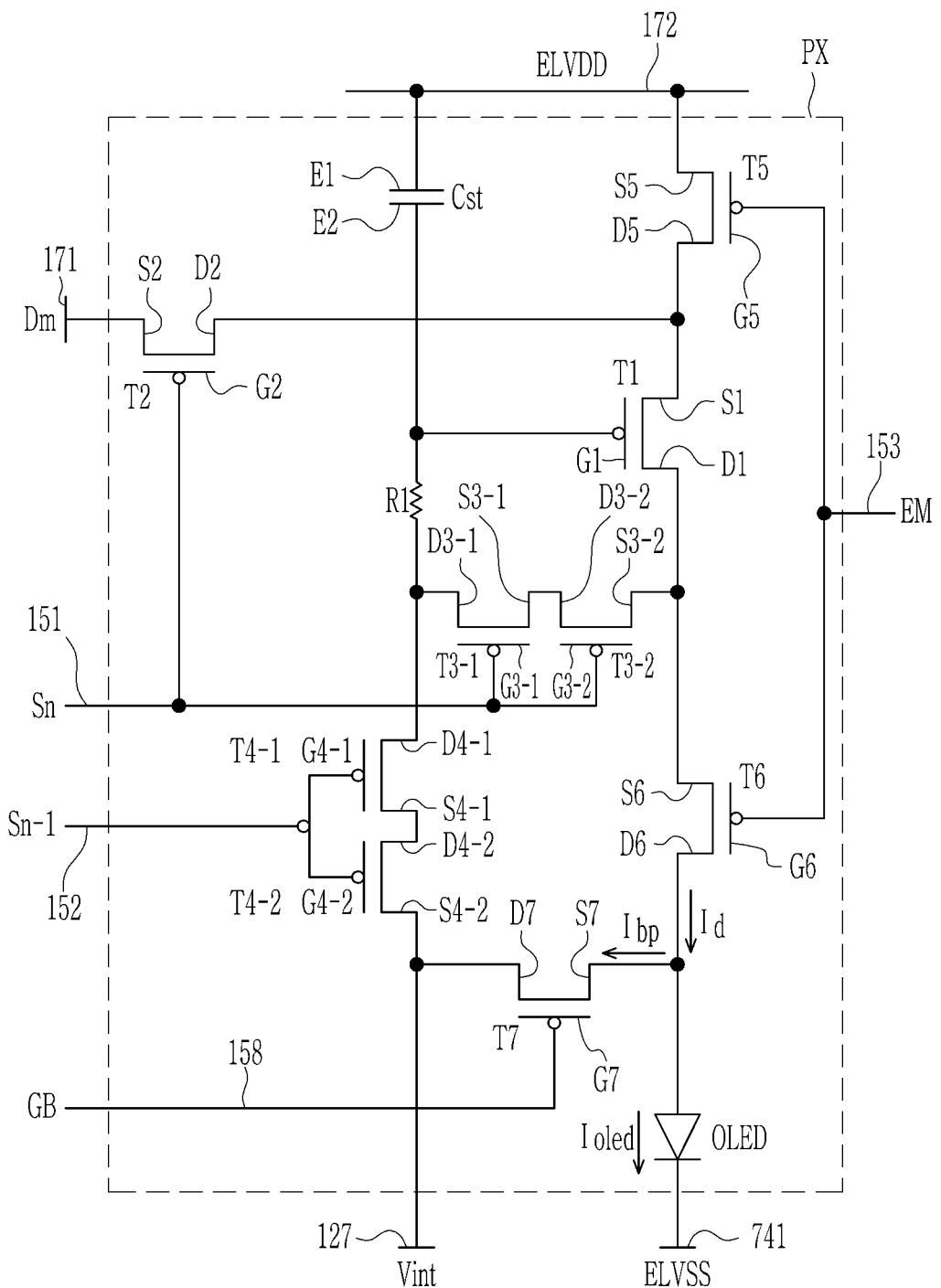
FIG. 1 illustrates an equivalent circuit diagram of one pixel of a light emitting display device according to an embodiment.

The present inventive concept will be described more fully hereinafter with reference to the accompanying drawings, in which embodiments of the inventive concept are shown. As those skilled in the art would realize, the described embodiments may be modified in various different ways, all without departing from the spirit or scope of the present inventive concept.

In order to clearly describe the present inventive concept, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, a display device according to an embodiment of the present inventive concept will be described in detail with reference to the accompanying drawings.

Hereinafter, a light emitting display device according to an embodiment will be described with reference to FIG. 1 and FIG. 2.

Figure 2:
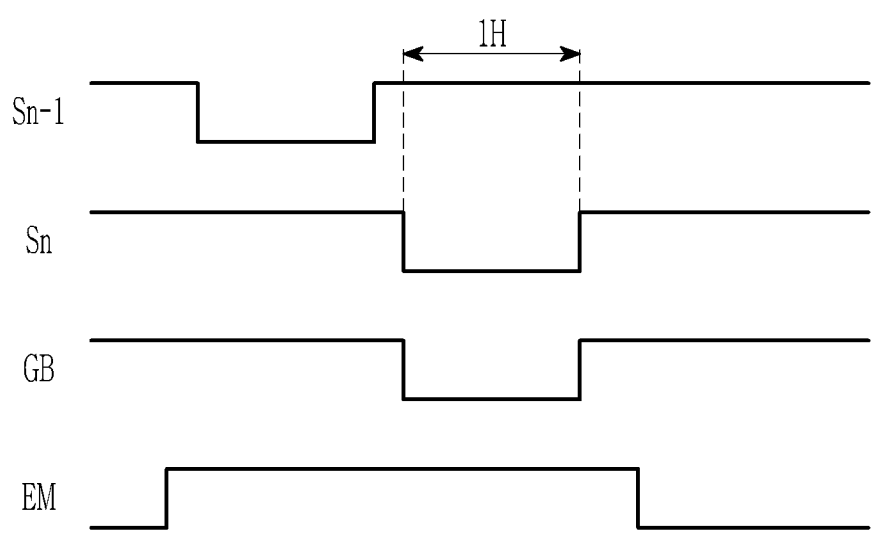
FIG. 2 illustrates a timing chart of a signal applied to one pixel of a light emitting display device according to an embodiment.

FIG. 1 illustrates an equivalent circuit diagram of one pixel of a light emitting display device according to an embodiment, and FIG. 2 illustrates a timing chart of a signal applied to one pixel of a light emitting display device according to an embodiment.

Referring to FIG. 1, a pixel PX of a light emitting display device includes a plurality of transistors T1, T2, T3, T4, T5, T6, and T7, a storage capacitor Cst, and a light emitting diode OLED which are connected to several signal lines 127, 151, 152, 153, 158, 171, 172, and 741.

Particularly, a first resistor R1 is positioned between a third transistor T3 and a gate electrode of a driving transistor T1, and thus a leakage current may be reduced. Although it will be separately described later, the first resistor R1 means a portion in which a thickness of the semiconductor layer is thinner than that of other areas.

Hereinafter, a structure of FIG. 1 will be described in detail.

The plurality of transistors T1, T2, T3, T4, T5, T6, and T7 include a first transistor T1 (hereinafter referred to as the driving transistor), a second transistor T2 (hereinafter referred to as a switching transistor) connected to a scan line 151, and the third transistor T3 (hereinafter referred to as a compensation transistor), and other transistors that are transistors for performing operations necessary to operate the light emitting diode OLED. The other transistors may include a fourth transistor T4, a fifth transistor T5, a sixth transistor T6, and a seventh transistor T7.

A plurality of signal lines may include the scan line 151, a previous scan line 152, a light emitting control line 153, a bypass control line 158, a data line 171, a driving voltage line 172, an initialization voltage line 127, and a common voltage line 741. The bypass control line 158 may be a portion of the previous scan line 152, or may be electrically connected thereto.

The scan line 151 is connected to a gate driver (not shown) to transmit a scan signal Sn to the second transistor T2 and the third transistor T3. The previous scan line 152 is connected to the gate driver to transmit a previous scan signal Sn−1 applied to the pixel PX positioned at a previous stage to the fourth transistor T4. The light emitting control line 153 is connected to a light emitting controller (not shown), and it transmits a light emitting control signal EM that controls a light emitting time of the light emitting diode OLED to the fifth transistor T5 and the sixth transistor T6. The bypass control line 158 transmits a bypass signal GB to the seventh transistor T7.

The data line 171 is a wire that transmits a data voltage Dm generated by a data driver (not shown), and luminance at which the light emitting diode OLED (also referred to as a light emitting element) emits light is changed according to the data voltage Dm. The driving voltage line 172 applies a driving voltage ELVDD, the initialization voltage line 127 transmits an initialization voltage Vint for initializing the driving transistor T1, and the common voltage line 741 applies a common voltage ELVSS. Voltages applied to the driving voltage line 172, the initialization voltage line 127, and the common voltage line 741 may be constant.

Hereinafter, a plurality of transistors will be described.

First, the driving transistor T1 is a transistor that adjusts an amount of output driving current Id according to the applied data voltage Dm, and the output driving current Id is applied to the light emitting diode OLED so that brightness of the light emitting diode OLED is adjusted according to the data voltage Dm. For this purpose, a first electrode S1 of the driving transistor T1 receives the driving voltage ELVDD and is connected to the driving voltage line 172 via the fifth transistor T5. In addition, the first electrode S1 of the driving transistor T1 is connected to a second electrode D2 of the second transistor T2 to receive the data voltage Dm. The second electrode D1 (output side electrode outputs a current toward the light emitting diode OLED and is connected to an anode electrode of the light emitting diode OLED via the sixth transistor T6. Meanwhile, a gate electrode G1 is connected to one electrode (a second storage electrode E2) of the storage capacitor Cst. Therefore, a voltage of the gate electrode G1 is changed according to a voltage stored in the storage capacitor Cst, and accordingly, the output driving current Id from the driving transistor T1 is changed.

The second transistor T2 is a transistor that transmits the data voltage Dm to the pixel PX. A gate electrode G2 is connected to the scan line 151, and a first electrode S2 is connected to the data line 171. The second electrode D2 of the second transistor T2 is connected to the first electrode S1 of the driving transistor T1. When the second transistor T2 is turned on according to the scan signal Sn transmitted through the scan line 151, the data voltage Dm transmitted through the data line 171 is transmitted to the first electrode S1 of the driving transistor T1.

The third transistor T3 is a transistor that allows a compensation voltage (Dm+Vth) changed as the data voltage Dm passes through the driving transistor T1 to be transmitted to the second storage electrode E2 of the storage capacitor Cst. The third transistor T3 includes a (3-1)-th transistor T3-1 and a (3-2)-th transistor T3-2 that are serially connected. The (3-1)-th transistor T3-1 and the (3-2)-th transistor T3-2 are connected to the same scan line 151, a first electrode S3-1 of the (3-1)-th transistor T3-1 and a second electrode of the (3-2)-th transistor T3-2 D3-2 are connected to each other, and a first electrode S3-2 of the (3-2)-th transistor T3-2 is connected to the second electrode D1 of the driving transistor T1. A second electrode D3-1 of the (3-1)-th transistor T3-1 is connected to the second storage electrode E2 of the storage capacitor Cst and the gate electrode G1 of the driving transistor T1. The third transistor T3, for example, the (3-1)-th transistor (T3-1) is turned on according to the scan signal Sn transmitted through a gate electrode (G3-1) of the (3-1)-th transistor (T3-1) which is a portion of the scan line 151 to connect the gate electrode G1 and the second electrode D1 of the driving transistor T1 and to connect the second electrode D1 of the driving transistor T1 and the second storage electrode E2 of the storage capacitor Cst.

The fourth transistor T4 initializes the gate electrode G1 of the driving transistor T1 and the second storage electrode E2 of the storage capacitor Cst. The fourth transistor T4 also includes a (4-1)-th transistor T4-1 and a (4-2)-th transistor T4-2 that are serially connected. The (4-1)-th transistor T4-1 and the (4-2)-th transistor T4-2 are connected to the same previous scan line 152, and a first electrode S4-1 of the (4-1)-th transistor T4-1 and a second electrode D4-2 of the (4-2)-th transistor T4-2 are connected to each other. In addition, a first electrode S4-2 of the (4-2)-th transistor T4-2 is connected to the initialization voltage line 127, and a second electrode D4-1 of the (4-1)-th transistor T4-1 is connected to the second storage electrode E2 of the storage capacitor Cst and the gate electrode G1 of the driving transistor T1 via a second electrode D3 of the third transistor T3. The fourth transistor T4 transmits the initialization voltage Vint to the gate electrode of the driving transistor T1 and the second storage electrode E2 of the storage capacitor Cst according to the previous scan signal Sn−1 received through the previous scan line 152. Accordingly, a gate voltage of the gate electrode G1 of the driving transistor T1 and the storage capacitor Cst are initialized. The initialization voltage Vint may have a low voltage value and it may be a voltage capable of turning on the driving transistor T1.

The fifth transistor T5 serves to transmit the driving voltage ELVDD to the driving transistor T1. A gate electrode G5 is connected to the light emitting control line 153 and a first electrode S5 is connected to the driving voltage line 172. A second electrode D5 of the fifth transistor T5 is connected to the first electrode S1 of the driving transistor T1.

The sixth transistor T6 serves to transmit the driving current Id outputted from the driving transistor T1 to the light emitting diode OLED. A gate electrode G6 is connected to the light emitting control line 153 and a first electrode S6 is connected to the second electrode D1 of the driving transistor T1. A second electrode D6 of the sixth transistor T6 is connected to the anode of the light emitting diode OLED.

The fifth transistor T5 and the sixth transistor T6 are simultaneously turned on according to the light emitting control signal EM transmitted through the light emitting control line 153, and when the driving voltage ELVDD is applied to the first electrode S1 of the driving transistor T1 through the fifth transistor T5, the driving transistor T1 outputs the driving current Id according to a voltage of the gate electrode G1 of the driving transistor T1 (that is, a voltage of the second storage electrode E2 of the storage capacitor Cst). The outputted driving current Id is transmitted to the light emitting diode OLED through the sixth transistor T6. The light emitting diode OLED emits light as a current holed flows through the light emitting diode OLED.

The seventh transistor T7 serves to initialize the anode of the light emitting diode OLED. A gate electrode G7 is connected to the bypass control line 158, a first electrode S7 is connected to the anode of the light emitting diode OLED, and a second electrode D7 is connected to the initialization voltage line 127. The bypass control line 158 may be connected to the scan line 151 and the bypass signal GB is applied as the same timing signal as the scan signal Sn. The bypass control line 158 may not be connected to the scan line 151, but may be connected to the previous scan line 152. When the seventh transistor T7 is turned on according to a bypass signal GB, the initialization voltage Vint is applied to the anode of the light emitting diode LED such that the light emitting diode OLED is initialized. In some embodiments, the seventh transistor T7 may not be included.

A first storage electrode E1 of the storage capacitor Cst is connected to the driving voltage line 172 and the second storage electrode E2 thereof is connected to the gate electrode G1 of the driving transistor T1, the second electrode D3-1 of the (3-1)-th transistor T3-1, and the second electrode D4-1 of the (4-1)-th transistor T4-1. As a result, the second storage electrode E2 determines a voltage of the gate electrode G1 of the driving transistor T1, and it receives the data voltage Dm through the second electrode D3-1 of the (3-1)-th transistor T3-1, or the initialization voltage Vint through the second electrode D4-1 of the (4-1)-th transistor T4-1.

Meanwhile, the anode of the light emitting diode OLED is connected to the second electrode D6 of the sixth transistor T6 and the first electrode S7 of the seventh transistor T7, and a cathode thereof is connected to the common voltage line 741 that transmits the common voltage ELVSS.

Referring to FIG. 1, the first resistor R1 is positioned between the second electrode D3-1 of the (3-1)-th transistor T3-1 and the gate electrode G1 of the driving transistor T1. The first resistor R1 may prevent the gate voltage of the driving transistor T1 from increasing due to a leakage current when a pixel circuit is driven at a low frequency. That is, the gate voltage of the driving transistor T1 may increase due to the leakage current during the low frequency driving, and in this case, the current flowing through the driving transistor T1 may decrease. As the brightness of the light emitting diode OLED is changed due to the decrease in current, a flicker of the display device may occur. However, in the display device according to the present embodiment, the first resistor R1 is positioned between the second electrode D3-1 of the (3-1)-th transistor T3-1 and the gate electrode G1 of the driving transistor T1. The leakage current of the circuit is reduced by the first resistor R1, the increase of the gate voltage of the driving transistor T1 is suppressed, and thus a flicker may be prevented during low frequency driving and the display device may be stably driven. The first resistor R1 may be realized by a method of making the thickness of the semiconductor layer of the corresponding area thinner than that of other areas. A specific structure thereof will be separately described later.

In the embodiment of FIG. 1, the pixel circuit includes seven transistors T1 to T7 and one capacitor Cst, but the configuration of the pixel circuit is not limited thereto, and the number of transistors, the number of capacitors, and their connection may be variously changed.

An operation of one pixel of the light emitting display device according to the embodiment will be described with reference to FIG. 1 and FIG. 2.

A waveform illustrated in FIG. 2 may be a waveform applied at a normal frequency of 60 Hz, but may also be a waveform applied at a lower frequency (for example, a frequency of 30 Hz or less). In addition, the light emitting display device according to the present embodiment is applied with a variable frequency such that an image may be displayed according to a normal frequency and a low frequency depending on a displayed image or user's setting. Particularly, even when the light emitting display device of the present embodiment displays an image at a low frequency, a flicker is not viewed.

During an initialization period, the previous scan signal Sn−1 of a low level is supplied to the pixel PX through the second scan line 152. In this case, the fourth transistor T4 to which the previous scan signal Sn−1 of the low level is applied is turned on, so that the initializing voltage Vint is applied to the gate electrode G1 of the driving transistor T1 and the second storage electrode E2 of the storage capacitor Cst through the fourth transistor T4. Accordingly, the driving transistor T1 and the storage capacitor Cst are initialized. Since the initializing voltage Vint is a low voltage, the driving transistor T1 is also turned on.

Thereafter, during a data writing period, the scan signal Sn of a low level is supplied to the pixel PX through the scan line 151. The second transistor T2 and the third transistor T3 are turned on by the scan signal Sn of the low level.

When the second transistor T2 is turned on, the data voltage Dm is inputted to the first electrode S1 of the driving transistor T1 through the second transistor T2. Because the driving transistor T1 is turned on by the initializing voltage Vint applied to the gate electrode G1 of the driving transistor T1 during the initialization period, the first electrode S1 of the driving transistor T1 may be electrically connected to the gate electrode G1 of the driving transistor T1 through the turned on third transistor T3. Therefore, the data voltage Dm transmitted to the first electrode S1 of the driving transistor T1 passes through the driving transistor T1 and the third transistor T3 to the gate electrode G1 of the driving transistor T1, then it is stored in the second storage electrode E2 of the storage capacitor Cst.

In this case, a voltage of the gate electrode G1 of the driving transistor T1 gradually increases by the data voltage Dm applied to the second storage electrode E2, and then a difference between a voltage of the gate electrode G1 and a voltage of the first electrode S1 is a threshold voltage Vth, the driving transistor T1 is turned off, and a voltage of the gate electrode G1 at this time is stored and maintained in the second storage electrode E2 of the storage capacitor Cst. In this case, since the voltage of the first electrode S1 is the data voltage Dm, the voltage stored in the second storage electrode E2 of the storage capacitor Cst is a voltage obtained by subtracting the threshold voltage Vth of the driving transistor T1 from the data voltage Dm.

Meanwhile, during the writing period, the bypass signal GB of a low level is applied to the seventh transistor T7. The seventh transistor T7 to which the bypass signal GB of the low level is applied is turned on, so that the initializing voltage Vint is applied to the anode of the light emitting diode OLED through the seventh transistor T7. As a result, the anode of the light emitting diode OLED is initialized.

Thereafter, during a light emitting period, since the light emitting control signal EM supplied from the light emitting control line 153 is a low level, the fifth transistor T5 and the sixth transistor T6 are turned on. As a result, the driving voltage ELVDD is applied to the first electrode S1 of the driving transistor T1, and the second electrode D1 of the driving transistor T1 is connected to the light emitting diode OLED. An amount of the output driving current Id of the driving transistor T1 is determined according to a difference between the voltage of the gate electrode G1 and the voltage (that is, the driving voltage ELVDD) of the first electrode S1. A voltage of the gate electrode G1 is stored in the storage capacitor Cst, and since the voltage is a voltage obtained by subtracting the threshold voltage Vth of the driving transistor T1 from the data voltage Dm, the amount of the outputted driving current Id of the driving transistor T1 is determined according to a voltage obtained by subtracting the data voltage Dm from the driving voltage ELVDD and then adding the threshold voltage Vth.

Among them, the threshold voltage Vth is a voltage used to turn on the driving transistor, and serves to compensate for characteristics of the driving transistor having various threshold voltages. In addition, since the driving voltage ELVDD has a constant value in all pixels, the outputted driving current Id of the driving transistor is determined according to the data voltage Dm.

Therefore, it is possible to output an output current of the driving transistor T1 to be constant even though the driving transistors T1 positioned in respective pixels PX have different threshold voltages Vth due to process deviation, thereby improving non-uniformity of the characteristics thereof and determining the driving current Id according to the applied data voltage Dm.

When the above-described light emitting period ends, the same operation is repeated from the initialization period.

One of the first electrode and the second electrode of each of the plurality of transistors T1, T2, T3, T4, T5, T6, and T7 may be a source electrode and the other thereof may be a drain electrode, depending on a direction in which a voltage or current is applied.

Meanwhile, in some embodiments, while the seventh transistor T7 initializes the anode of the light emitting diode OLED in the initialization period, it may prevent even a small amount of current from flowing toward the light emitting diode when the driving transistor T1 is not actually turned on. In this case, a small amount of current is discharged through the seventh transistor T7 to a terminal of the initializing voltage Vint as a bypass current Ibp. Accordingly, the light emitting diode OLED does not emit unnecessary light, so that a black gray may be displayed more clearly and a contrast ratio may be improved. In this case, the bypass signal GB may be a signal having different timing from that of the previous scan signal Sn−1. In some exemplary embodiments, the seventh transistor T7 may be omitted.

Hereinafter, a pixel arrangement structure of a light emitting display device according to an embodiment will be described in detail with reference to FIG. 3 and FIG. 4.

Figure 3:
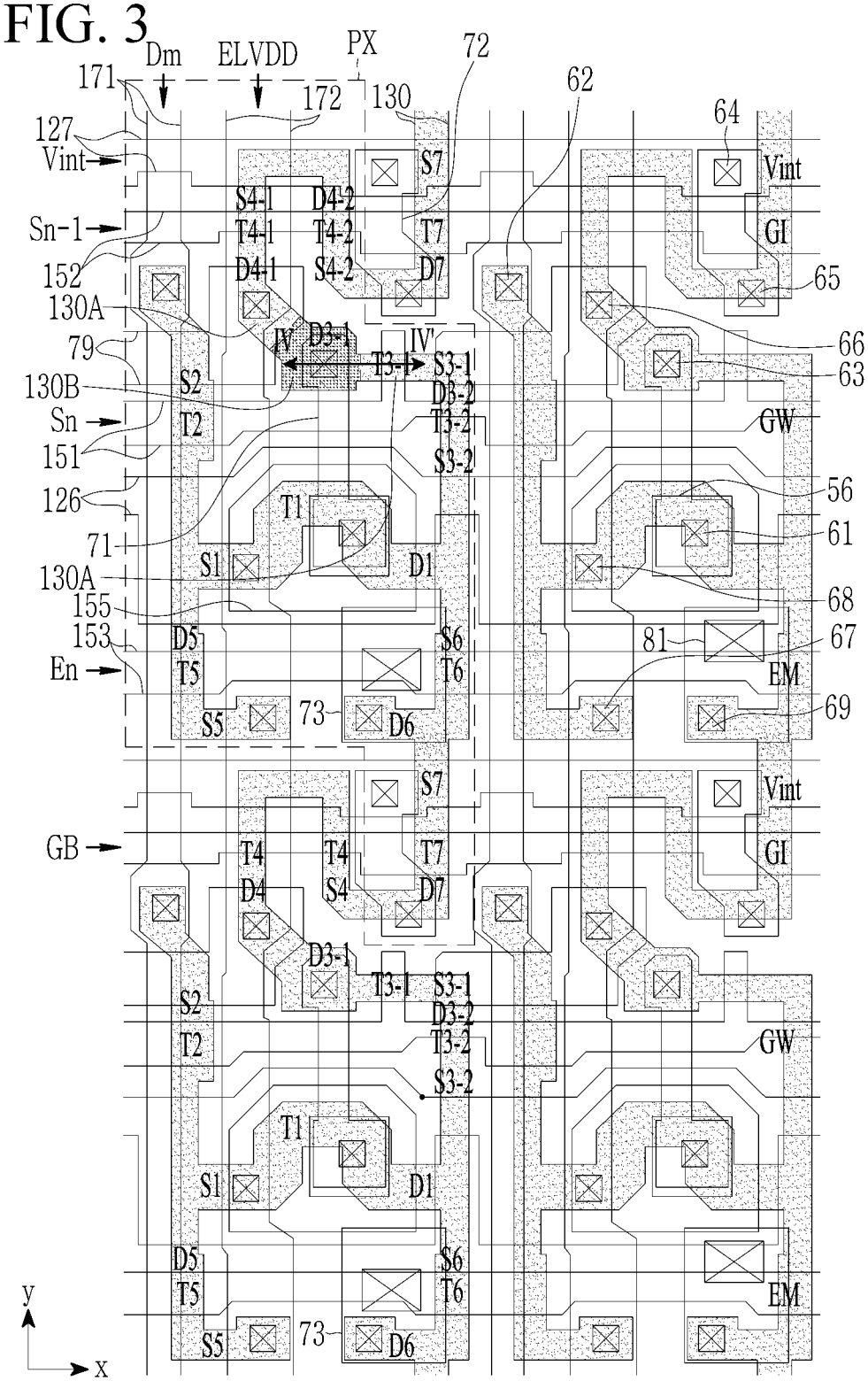
FIG. 3 illustrates a layout view of one pixel of a light emitting display device according to an embodiment.
Figure 4:
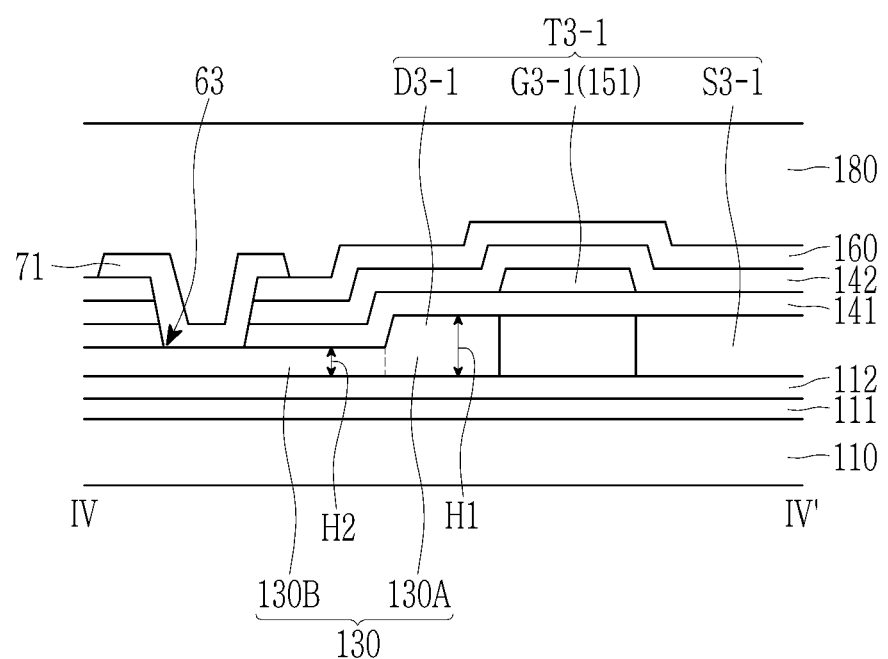
FIG. 4 illustrates a cross-sectional view taken along line IV-IV' of FIG. 3.

FIG. 3 illustrates a layout view of one pixel of a light emitting display device according to an embodiment, and FIG. 4 illustrates a cross-sectional view taken along line IV-IV' of FIG. 3.

Referring to FIG. 3, the light emitting display device according to the embodiment includes the scan line 151, the previous scan line 152, the light emitting control line 153, and the initializing voltage line 127, which substantially extend along the first direction x and transmit the scan signal Sn, the previous scan signal Sn−1, the light emitting control signal EM, and the initializing voltage Vint, respectively. The bypass signal GB is transmitted through the previous scan line 152. The light emitting display device includes the data line 171 and the driving voltage line 172 that extend along a second direction y crossing a first direction x and that transmit the data voltage Dm and the driving voltage ELVDD, respectively.

The light emitting display device includes the driving transistor T1, the second transistor T2, the third transistor T3, the fourth transistor T4, the fifth transistor T5, the sixth transistor T6, the seventh transistor T7, the storage capacitor Cst, and the light emitting diode OLED.

The light emitting diode OLED includes a pixel electrode, a light emitting layer, and a common electrode.

Respective channels of the driving transistor T1, the second transistor T2, the third transistor T3, the fourth transistor T4, the fifth transistor T5, the sixth transistor T6, and the seventh transistor T7 are positioned in a semiconductor layer 130. In addition, at least portions of the first and second electrodes of the plurality of transistors T1, T2, T3, T4, T5, T6, and T7 are also positioned in the semiconductor layer 130. The semiconductor layer 130 (a portion in which shading is added in FIG. 3, hereinafter the same) may be variously bent. The semiconductor layer 130 is formed of polysilicon, and in the case of the polysilicon, a leakage current thereof is large compared to other semiconductors, and thus a flicker may be viewed when driven at a low frequency. However, in the present embodiment, the thickness of the semiconductor layer 130 in the area between the second electrode D3-1 of the third transistor T3 and the gate electrode G1 of the driving transistor T1 is adjusted to reduce a leakage current to enable low frequency driving. As a result, since a separate semiconductor layer such as an oxide semiconductor may not be further formed, it is possible to dramatically reduce time and costs in a process aspect.

The semiconductor layer 130 may include a channel in which impurities are not doped, and first and second doped regions that are positioned at respective sides of the channel and are doped with impurities. The first doped region and the second doped region correspond to the first and second electrodes of the plurality of transistors T1, T2, T3, T4, T5, T6, and T7, respectively, and when one of the first doped region and the second doped region is a source region, the other one corresponds to a drain region. In addition, in the semiconductor layer 130, regions between the first and second electrodes of two different transistors are also doped, so that the two transistors may be electrically connected to each other.

Each of the channels of the plurality of transistors T1, T2, T3, T4, T5, T6, and T7 overlaps the gate electrode of each of the transistors T1, T2, T3, T4, T5, T6, and T7, and is positioned between the first electrode and the second electrode of each of the transistors T1, T2, T3, T4, T5, T6, and T7. On the other hand, when the semiconductor layer 130 is doped, after a gate electrode is formed, a doping process is performed using the gate electrode as a mask to reduce the cost by reducing the number of masks. The plurality of transistors T1, T2, T3, T4, T5, T6, and T7 may have a substantially same stacked structure. Hereinafter, the driving transistor T1 will be mainly described in detail, and the remaining transistors T2, T3, T4, T5, T6, and T7 will be briefly described.

The driving transistor T1 includes a channel, a gate electrode 155, a first electrode S1, and a second electrode D1. The channel of the driving transistor T1 is disposed between the first electrode S1 and the second electrode D1, and overlaps the gate electrode 155 in a plan view. The channel is curved in order to form a long channel length in a limited region. A driving range of a gate voltage Vg applied to the gate electrode 155 of the driving transistor T1 is widened as a length of the channel increases, and the driving current Id steadily increases in accordance with the gate voltage Vg. Accordingly, a gray of light emitted from the light emitting diode OLED may be finely controlled by changing the gate voltage Vg, and the display quality of the light emitting display device may also be improved. In addition, since the channel extends in several directions rather than extending in one direction, effects due to directionality are offset in a manufacturing process, thereby reducing an effect of process deviation. Therefore, it is possible to prevent degradation in image quality such as spot defects (for example, a luminance difference occurring depending on pixels even if the same data voltage Dm is applied) capable of occurring due to the characteristic of the driving transistor T1 that is varied according to the area of the display device due to the process deviation. The shape of the channel is not limited to the illustrated horseshoe shape (S2 shape), and the channel may have various shapes.

The gate electrode 155 overlaps the channel in a plan view. The first and second electrodes S1 and S2 are positioned at opposite sides of the channel. An extended portion of a storage line 126 is positioned on the gate electrode 155 to cover the gate electrode 155 in a plan view. The extended portion of the storage line 126 may completely cover the gate electrode 155 with a second gate insulating film disposed therebetween in a plan view to form the storage capacitor Cst. The extended portion of the storage line 126 is a first electrode (E1 of FIG. 1) of the storage capacitor Cst and the gate electrode 155 is a second storage electrode (E2 of FIG. 1). The extended portion of the storage line 126 is provided with an opening 56 formed so that the gate electrode 155 may be connected to the first data connecting member 71. In the opening 56, an upper surface of the gate electrode 155 and the first data connecting member 71 are electrically connected through a contact hole 61. The first data connecting member 71 is connected to the second electrode D3-1 of the third transistor T3-1 to connect the gate electrode 155 of the driving transistor T1 and the second electrode D3-1 of the third transistor T3-1.

The gate electrode of the second transistor T2 may be a portion of the scan line 151. The data line 171 is connected to the first electrode of the second transistor T2 through a contact hole 62, and the first electrode S2 and the second electrode D2 may be positioned on the semiconductor layer 130.

The third transistor T3 is formed with two transistors T3-1 and T3-2 serially connected to each other. The two transistors T3-1 and T3-2 are combined to serve as the third transistor T3. The gate electrodes G3-1 and G3-2 of the (3-1)-th transistor T3-1 and the (3-2)-th transistor T3-2 are connected to the same scan line 151, and the first electrode S3-1 of the (3-1)-th transistor T3-1 and the second electrode D3-2 of the (3-2)-th transistor T3-2 are connected to each other. In addition, the first electrode S3-2 of the (3-2)-th transistor T3-2 is connected to the second electrode D1 of the driving transistor T1 and the first electrode S6 of the sixth transistor T6 through the semiconductor layer 130, and the second electrode D3-1 of the (3-1)-th transistor T3-1 is connected to the gate electrode G1 of the driving transistor T1 through the data connecting member 71 connected through a contact hole 63.

Although the leakage current may be partially reduced through the dual structure in which two transistors are serially connected to each other, since a flicker may still be viewed when driven at a low frequency, it is necessary to reduce the thickness of the semiconductor layer 130 between the second electrode D3-1 of the (3-1)-th transistor T3-1 and the gate electrode G1 of the driving transistor T1 as follows.

Referring to FIG. 3 and FIG. 4, the semiconductor layer 130 adjacent to the third transistor T3 includes a first area 130A having a first thickness H1 and a second area 130B having a second thickness H2. In this case, the second thickness H2 may be thinner than the first thickness H1. For example, the first thickness H1 may be 400 Å to 500 Å, and the second thickness H2 may be 300 Å to 400 Å. In addition, as an example, the second thickness H2 may be 60% to 90% of the first thickness H1. Alternatively, a difference between the first thickness H1 and the second thickness H2 may be 80 Å to 120 Å.

As shown in FIG. 3, the third transistor T3 may be positioned in the first area 130A, and the second area 130B may be an area surrounding the contact hole 63 in which the second electrode D4-1 of the (4-1)-th transistor T4-1 is connected to the gate electrode G1 of the driving transistor T1 through the first data connecting member 71 and disposed adjacent to the third transistor T3. As shown in FIG. 3, most of the area of the semiconductor layer 130 may correspond to the first area 130A, and a partial area thereof surrounding the contact hole 63 and disposed adjacent to the third transistor T3 may be the second area 130B. Although it will be separately described later, the second region 130B with such a thin thickness may reduce the leakage current of the pixel circuit.

FIG. 3 illustrates an embodiment in which the second area 130B is positioned to surround the contact hole 63 and be adjacent to the third transistor T3, but the position of the second area 130B may be varied according to embodiments. In various embodiments to be described later, the position of the second area 130B may be changed.

The fourth transistor T4 includes two fourth transistors T4-1 and T4-2 serially connected to each other. The two transistors T4-1 and T4-2 are combined to serve as the fourth transistor T4. Gate electrodes G4-1 and G4-2 of the (4-1)-th transistor T4-1 and the (4-2)-th transistor T4-2 are connected to the same previous scan line 152, and the first electrode S4-1 of the (4-1)-th transistor T4-1 and the second electrode D4-2 of the (4-2)-th transistor T4-2 are connected to each other. In addition, the second electrode D4-1 of the (4-1)-th transistor T4-1 is connected to the gate electrode G1 of the driving transistor T1 through the first data connecting member 71 connected through the contact hole 63, and the first electrode S4-2 of the (4-2)-th transistor T4-2 is connected to the initializing voltage line 127 through a second data connecting member 72 connected through a contact holes 64 and 65.

The two fourth transistors T4-1 and T4-2 are formed in a portion where the previous scan line 152 crosses the semiconductor layer 130, and the semiconductor layer 130 has a structure that extends upward, extends in one direction, then extends downward again, that is, the previous scan line 152 may intersect the semiconductor layer twice to form the two fourth transistors T4-1 and T4-2.

The gate electrode of the fifth transistor T5 may be a portion of the light emitting control line 153. The driving voltage line 172 is connected to the first electrode S5 of the fifth transistor T5 through a contact hole 67, and the second electrode D5 thereof is connected to the first electrode S1 of the driving transistor T1 through the semiconductor layer 130.

The gate electrode of the sixth transistor T6 may be a portion of the light emitting control line 153. A third data connecting member 73 is connected to the second electrode D6 of the sixth transistor T6 through a contact hole 69, and the first electrode S6 is connected to the second electrode D1 of the driving transistor through the semiconductor layer 130.

The gate electrode of the seventh transistor T7 may be a portion of the previous scan line 152. The third data connecting member 73 is connected to the first electrode S7 of the seventh transistor T7 through a contact hole 81, and the second electrode is connected to the first electrode S4 of the fourth transistor T4.

The storage capacitor Cst includes the first storage electrode E1 and the second storage electrode E2 which overlap each other with a second gate insulating film 142 disposed therebetween. The second storage electrode E2 corresponds to the gate electrode 155 of the driving transistor T1, and the first storage electrode E1 may be the extended portion of the storage line 126. Herein, the second gate insulating film 142 becomes a dielectric, and a capacitance is determined by a charge stored in the storage capacitor Cst and a voltage difference between the first and second storage electrodes E1 and E2. By using the gate electrode 155 as the second storage electrode E2, a space capable of forming the storage capacitor Cst in a space that is narrowed by the channel of the driving transistor T1 occupying a large area in the pixel may be secured.

The driving voltage line 172 is connected to the first storage electrode E1 through a contact hole 68. Therefore, the storage capacitor Cst stores a charge corresponding to a difference between the driving voltage ELVDD transmitted to the first storage electrode E1 through the driving voltage line 172 and the gate voltage Vg of the gate electrode 155.

The second data connecting member 72 is connected to the initializing voltage line 127 through a contact hole 64. The pixel electrode (not shown) is connected to the third data connecting member 73 through the contact hole 81.

A parasitic capacitor control pattern 79 may be positioned adjacent to the two transistors T3-1 and T3-2 of a dual structure of the third transistor T3. A parasitic capacitor exists in the pixel and image quality characteristics may change when the voltage applied to the parasitic capacitor is changed. The driving voltage line 172 is connected to the parasitic capacitor control pattern 79 through a contact hole 66. Therefore, it is possible to prevent the image quality characteristic from being changed by applying the driving voltage ELVDD, which is a constant DC voltage, to the parasitic capacitor. The parasitic capacitor control pattern 79 may be formed in a different area from that shown, and a voltage other than the driving voltage ELVDD may be applied. Alternatively, in some embodiments, it may be omitted.

Hereinafter, a cross-sectional structure of the light emitting display device according to the embodiment will be described according to a stacked order with reference to FIG. 3 and FIG. 4.

The light emitting display device according to the embodiment uses a rigid substrate such as a glass substrate or a substrate 110 made of a flexible material such as plastic or polyimide (PI). A barrier layer 111 is positioned on the substrate 110, and a buffer layer 112 is positioned on the barrier layer 111. The barrier layer 111 and the buffer layer 112 may include an inorganic insulating material such as a silicon oxide, a silicon nitride, or an aluminum oxide, and may also include an organic insulating material such as a polyimide acrylic (epoxy added).

The semiconductor layer 130 that constitutes the channels of the plurality of transistors T1, T2, T3, T4, T5, T6, and T7, the first electrode, and the second electrode and is made of polysilicon is positioned on the buffer layer 112.

In this case, the thickness of the semiconductor layer 130 disposed to surround the contact hole 63 in which the second electrode D4-1 of the (4-1)-th transistor T4-1 is connected to the gate electrode G1 of the driving transistor T1 through the first data connecting member 71 and disposed adjacent to the third transistor T3 may be thinner than the thickness of the semiconductor layer 130 in other areas. For example, at least, the thickness of the semiconductor layer 130 disposed between the second electrode D3-1 of the (3-1)-th transistor T3-1 and the second electrode D4-1 of the (4-1)-th transistor T4-1 may be thinner than the thickness of the semiconductor layer 130 in other areas. That is, the semiconductor layer 130 may include the first area 130A having the first thickness H1 and the second area 130B having the second thickness H2, wherein the second thickness H2 may be thinner than the first thickness H1.

Referring to FIG. 4, the thickness of the semiconductor layer 130 adjacent to the second electrode of the third transistor T3 may be thinner than the thickness of the semiconductor layer 130 in other areas. That is, the semiconductor layer 130 may include the first area 130A having the first thickness H1 and the second area 130B having the second thickness H2, wherein the second thickness H2 may be thinner than the first thickness H1. For example, the first thickness H1 may be 400 Å to 500 Å, and the second thickness H2 may be 300 Å to 400 Å. In addition, as an example, the second thickness H2 may be 60% to 90% of the first thickness H1. Alternatively, a difference between the first thickness H1 and the second thickness H2 may be 80 Å to 120 Å.

The second thickness H2 of the semiconductor layer 130 described above is in a thickness range for effectively reducing the leakage current. That is, when the second thickness H2 is less than 60% of the first thickness H1, the second thickness H2 becomes too thin and the resistance excessively increases, which may decrease the efficiency of the display device. In addition, when the second thickness H2 is larger than 90% of the first thickness H1, the effect of reducing the leakage current may be negligible.

Referring simultaneously to FIG. 3 and FIG. 4, the second area 130B of the semiconductor layer 130 is positioned between the second electrode D3-1 of the (3-1)-th transistor T3-1 and the second electrode D4-1 of the (4-1)-th transistor T4-1 in which the second electrode D3-1 of the (3-1)-th transistor T3-1 and the gate electrode G1 of the driving transistor T1 are connected. That is, in the present embodiment, most of the semiconductor layer 130 is the first area 130A with the first thickness H1, and as shown in FIG. 4, the semiconductor layer 130 may have the second thickness H2 in a partial area in which the gate electrode G1 of the driving transistor T1 and the second electrode D3-1 of the (3-1)-th transistor T3-1 are connected. This thinner second area 130B may reduce the leakage current of the pixel circuit. Since the leakage current is reduced by the second area 130B of the semiconductor layer 130 with a thin thickness, the second area 130B may function as the first resistor R1 as shown in FIG. 1. A specific leakage current reduction effect will be described later with reference to FIG. 8 to FIG. 10.

Referring back to FIG. 3 and FIG. 4, a first gate insulating film 141 covering the semiconductor layer 130 is positioned.

Here, the first gate insulating film 141 may be formed of a silicon oxide film (SiOx) of a single-layer, or of a double film in which a silicon nitride film (SiNx) is positioned on a silicon oxide film (SiOx). In addition, a thickness of the first gate insulating film 141 may be 800 Å or more and 1200 Å or less.

A first gate conductor including the gate electrodes (second storage electrode E2) of the plurality of transistors T1, T2, T3, T4, T5, T6, and T7, the scan line 151, the previous scan line 152, and the light emitting control line 153 is positioned on the first gate insulating film 141. The second gate insulating film 142 is positioned on the first gate conductor to cover the first gate conductor. The first gate insulating film 141 and the second gate insulating film 142 may be made of a material such as a silicon nitride, a silicon oxide, or an aluminum oxide. A second gate conductor including the storage line 126, the first storage electrode E1, the initializing voltage line 127, and the parasitic capacitor control pattern 79 is positioned on the second gate insulating film 142.

An interlayer insulating film 160 is positioned on the second gate conductor to cover the second gate conductor. The interlayer insulating film 160 may be made of a material such as a silicon nitride, a silicon oxide, and an aluminum oxide, and may be made of an organic insulating material. A data conductor including the data line 171, the driving voltage line 172, the first data connecting member 71, the second data connecting member 72, and the third data connecting member 73 is positioned on the interlayer insulating film 160.

A passivation film 180 is positioned on the data conductor to cover it. The passivation film 180, also referred to as a planarization film, may include an organic insulating material. A pixel electrode (not shown) is positioned on the passivation film 180. The pixel electrode is connected to the third data connecting member 73 through the contact hole 81 formed in the passivation film 180. A partition wall (not shown) is positioned on the passivation film 180 and the pixel electrode. The partition wall is provided with an open portion overlapping the pixel electrode, and a light emitting layer is positioned in the open portion. A common electrode (not shown) is positioned on the light emitting layer and the partition wall. The pixel electrode, the light emitting layer, and the common electrode form the light emitting diode OLED.

In some embodiments, the pixel electrode may be an anode which is a hole injection electrode, and the common electrode may be a cathode which is an electron injection electrode. In contrast, the pixel electrode may be a cathode, and the common electrode may be an anode. When holes and electrons are injected into the light emitting layer from the pixel electrode and the common electrode, respectively, light is emitted when excitons in which the injected holes and electrons are combined enter a ground state from an excited state. Here, the light emitting layer may be an organic light emitting layer including an organic material or an inorganic light emitting layer made of an inorganic material.

The scan line 151, the previous scan line 152, and the light emitting control line 153, which are formed with the first gate conductor, extend in the first direction (x-direction), and the storage line 126 and the initialization voltage line 127, which are formed with the second gate conductor, also extend in the first direction (x-direction). Meanwhile, the data line 171 and driving voltage line 172 formed with the data conductor extend in the second direction (y-direction).

The data line 171 is connected to the first electrode of the second transistor T2 through the contact hole 62 formed in the first gate insulating film 141, the second gate insulating film 142, and the interlayer insulating film 160.

The driving voltage line 172 is connected to the first electrode S5 of the fifth transistor T5 through the contact hole 67 formed in the first gate insulating film 141, the second gate insulating film 142, and the interlayer insulating film 160, is connected to the extended portion of the storage line 126 (first storage electrode E1) through the contact hole 68 formed in the interlayer insulating film 160, and is connected to the parasitic capacitor control pattern 79 through the contact hole 66 formed in the interlayer insulating film 160.

One end of the first data connecting member 71 is connected to the gate electrode 155 through the contact hole 61 formed in the second gate insulating film 142 and the interlayer insulating film 160, and the other end thereof is connected to the second electrode D3-1 of the second electrode D3-1 of the (3-1)-th transistor T3-1 and the second electrode D4-1 of the (4-1)-th transistor T4-1 through the contact hole 63 formed in the first gate insulating film 141, the second gate insulating film 142, and the interlayer insulating film 160.

One end of the second data connecting member 72 is connected to the first electrode S4-2 of the (4-2)-th transistor T4-2 through the contact hole 65 formed in the first gate insulating film 141, the second gate insulating film 142, and the interlayer insulating film 160, and the other end thereof is connected to the initializing voltage line 127 through the contact hole 64 formed in the interlayer insulating film 160.

The third data connecting member 73 is connected to the second electrode D6 of the sixth transistor T6 through the contact hole 69 formed in the first gate insulating film 141, the second gate insulating film 142, and the interlayer insulating film 160.

Although not shown, an encapsulation layer (not shown) for protecting the light emitting diode OLED is positioned on the common electrode. The encapsulation layer may be in contact with the common electrode, or may be spaced apart from the common electrode. The encapsulation layer may be a thin film encapsulation layer in which an inorganic film and an organic film are stacked, and may include a triple layer formed of an inorganic film, an organic film, and an inorganic film. A capping layer and a functional layer may be positioned between the common electrode and the encapsulation layer.

In some embodiments, a touch electrode may be formed on the encapsulation layer so that a touch may be detected.

As described above, in the display device according to the present embodiment, the thickness of the semiconductor layer 130 in the area in which the third transistor and the gate electrode of the first transistor are connected is thinner than that of the other portions. This thin area of the semiconductor layer 130 may reduce a leakage current through the third transistor T3 to the gate electrode G1 of the driving transistor T1 and prevent a flicker from occurring during low frequency driving.

In this case, the semiconductor layer 130 may be manufactured by a method of partially etching amorphous silicon after crystallizing it into polysilicon.

Figure 5:
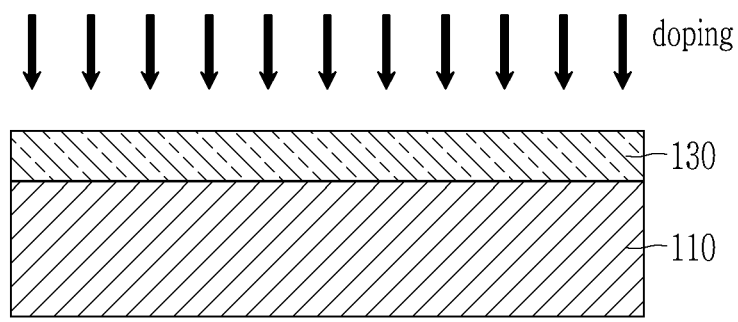
FIGS. 5, 6 and 7 illustrate a process of manufacturing a first area and a second area of a semiconductor layer according to an embodiment.
Figure 6:
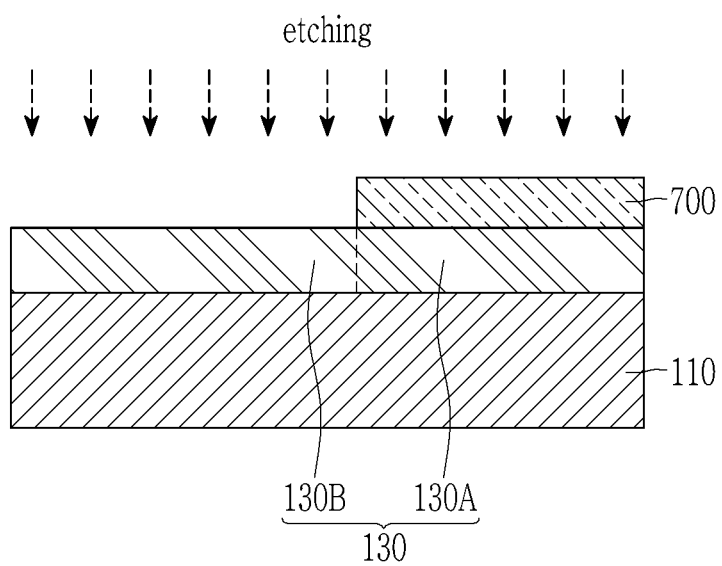
Figure 7:
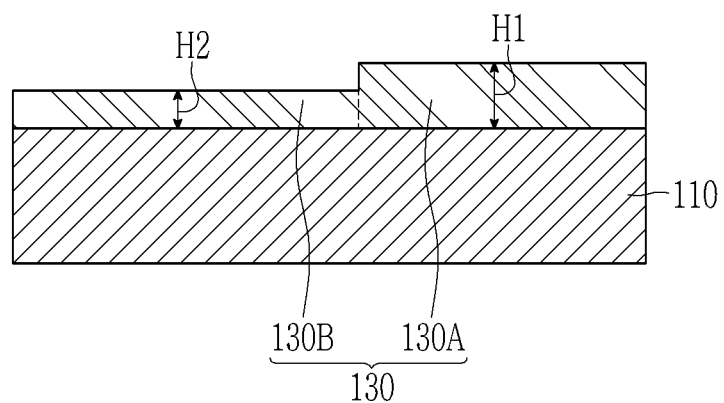

FIG. 5 to FIG. 7 illustrate a process of manufacturing the first area 130A and the second area 130B of the semiconductor layer 130 according to the present embodiment.

Referring to FIG. 5, an amorphous silicon layer is first formed on the substrate 110. A polysilicon layer is formed by crystallizing the amorphous silicon layer. Next, the crystallized silicon layer is doped with a dopant to form the semiconductor layer 130 which include a doped region. FIG. 5 shows a configuration in which the ion doping is performed on the crystallized polysilicon layer.

Next, referring to FIG. 6, a photoresist 700 is positioned on the semiconductor layer 130. In this case, the photoresist 700 may not overlap an area in which the thickness of the semiconductor layer 130 is to be thinned. That is, the photoresist 700 may overlap the first area 130A of the semiconductor layer 130 and may not overlap the second area 130B.

Next, referring to FIG. 6, the semiconductor layer 130 is etched. In this case, the etching may be wet etching using an etchant, but the method of etching is not limited thereto. The etchant may be a buffered oxide etch (BOE), but the etchant is not limited thereto. In the etching process of FIG. 6, the etchant etches the semiconductor layer 130 that is not covered by the photoresist 700. In this case, the semiconductor layer 130 that is covered by the photoresist 700 is not etched, and only the semiconductor layer 130 that is not covered by the photoresist 700 is etched such that the thickness thereof is reduced.

FIG. 7 illustrates the etched semiconductor layer 130. Referring to FIG. 7, the semiconductor layer 130 includes the first area 130A having the first thickness H1 and the second area 130B having the second thickness H2.

In this case, in FIG. 7, the second thickness H2 may be 100 Å thinner than the first thickness H1. For example, the first thickness H1 may be 400 Å to 500 Å, and the second thickness H2 may be 300 Å to 400 Å. The second thickness H2 may be 10% to 40% thinner than the first thickness H1. In the second area 130B having the thin thickness of the semiconductor layer 130, the leakage current of the display device may be reduced.

Figure 8:
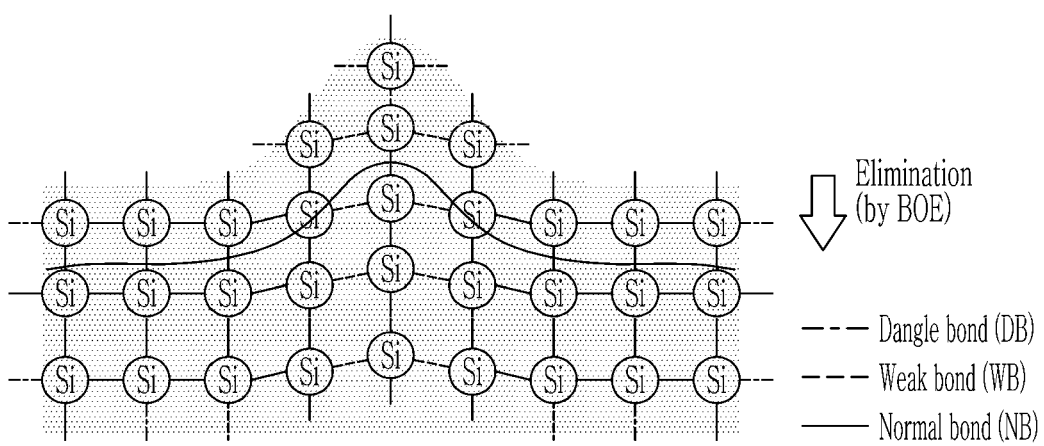
FIG. 8 schematically illustrates a cross-section of a semiconductor layer.
Figure 9:
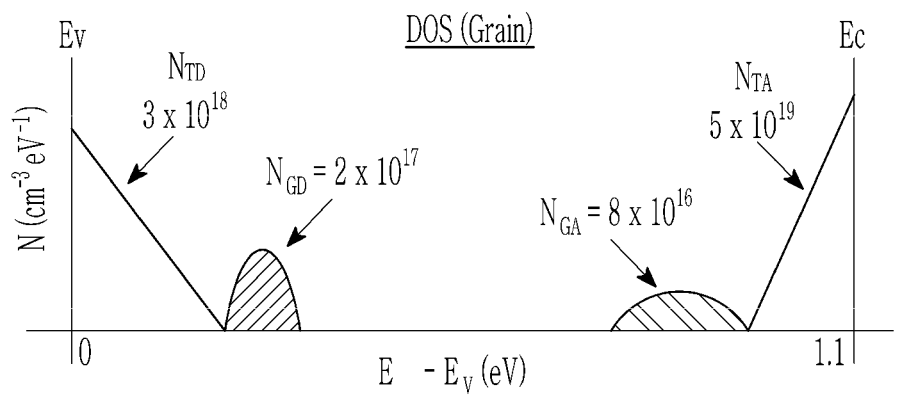
FIG. 9 illustrates a concentration (DOS, defect of density) of dangling bonds in a grain of a semiconductor layer.
Figure 10:
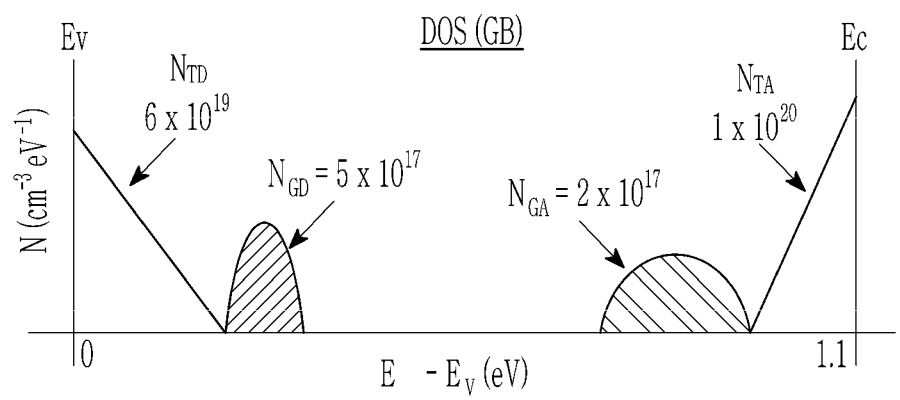
FIG. 10 illustrates a concentration (DOS, defect of density) of dangling bonds at a grain boundary of a semiconductor layer.

FIG. 8 to FIG. 10 illustrate a principle that the leakage current is reduced by reducing the thickness of the semiconductor layer 130.

FIG. 8 schematically illustrates a cross-section of the semiconductor layer 130, illustrating a dangling bond (DB), a normal bond (NB), and a weak bond (WB) in the semiconductor layer 130 made of a crystalline silicon layer. This dangling bond DB causes an increase in the amount of leakage current. Referring to FIG. 8, the dangling bond DB is concentrated on a surface of the semiconductor layer 130.

FIG. 8 shows an area etched by etching. As shown in FIG. 8, the etching is performed from the surface of the semiconductor layer 130. Accordingly, a plurality of dangling bonds positioned on the surface of the semiconductor layer 130 are removed during the etching process. Since the dangling bonds are removed by the etching, the semiconductor layer with the etched surface may reduce leakage current compared with the semiconductor layer without the etched surface.

In addition, as described in FIG. 5 to FIG. 7, the semiconductor layer 130 of the display device according to the present embodiment is etched in a polysilicon state after crystallizing amorphous silicon. In the step of crystallizing the amorphous silicon, a plurality of grains are formed, and a grain boundary is formed between the grains. In this case, more dangling bonds are positioned at the grain boundary than in the grain. FIG. 9 illustrates a concentration (DOS, defect of density) of dangling bonds in a grain of a semiconductor layer, and FIG. 10 illustrates a concentration (DOS, defect of density) of dangling bonds at a grain boundary of a semiconductor layer. The shaded area in FIG. 9 and FIG. 10 is the amount of the dangling bonds. In FIG. 9 and FIG. 10, a horizontal length of the graph is a band gap, and FIG. 9 and FIG. 10 illustrate the number of dangling bonds at each energy level. Comparing FIG. 9 and FIG. 10, it was confirmed that the amount of dangling bonds in the grain boundary (FIG. 10) was larger than that of the grain (FIG. 9).

Therefore, etching in a polysilicon state having grains and grain boundaries formed by crystallization rather than etching in an amorphous silicon state may effectively remove dangling bonds and prevent a leakage current caused by dangling bonds. Therefore, the semiconductor layer 130 according to the present embodiment may be etched in the crystallized polysilicon state.

FIG. 1 to FIG. 4 illustrate the configuration in which the second area 130B having the thin thickness of the semiconductor layer 130 is positioned between the gate electrode of the driving transistor T1 and the third transistor T3, for example, the (3-1)-th transistor T3-1, but the present inventive concept is not limited thereto.

The semiconductor layer 130 may have a thin thickness wherever it may reduce the amount of leakage current flowing into the gate electrode G1 of the driving transistor T1.

Figure 11:
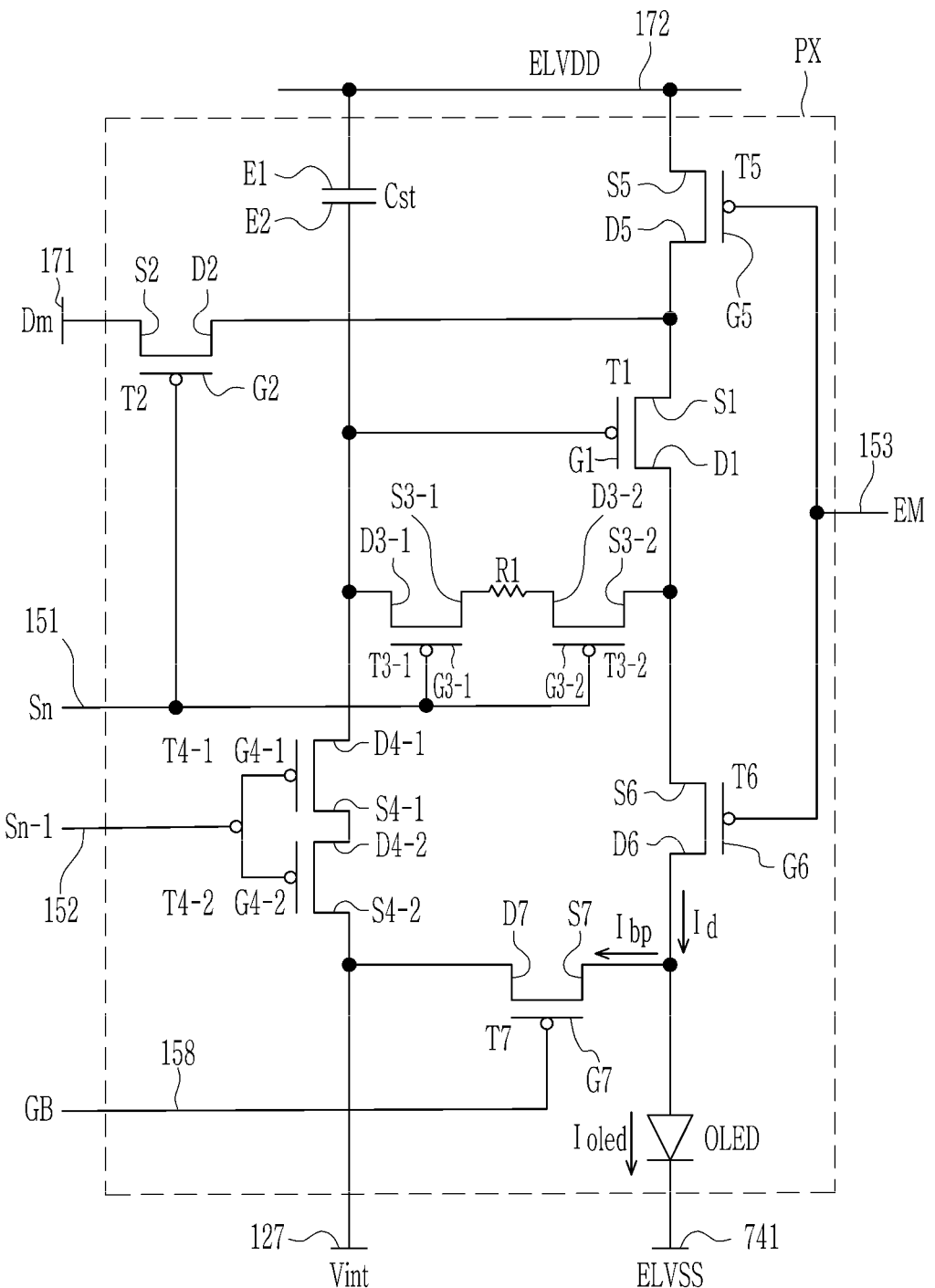
FIG. 11 illustrates an equivalent circuit diagram of a pixel in a display device according to another embodiment.
Figure 12:
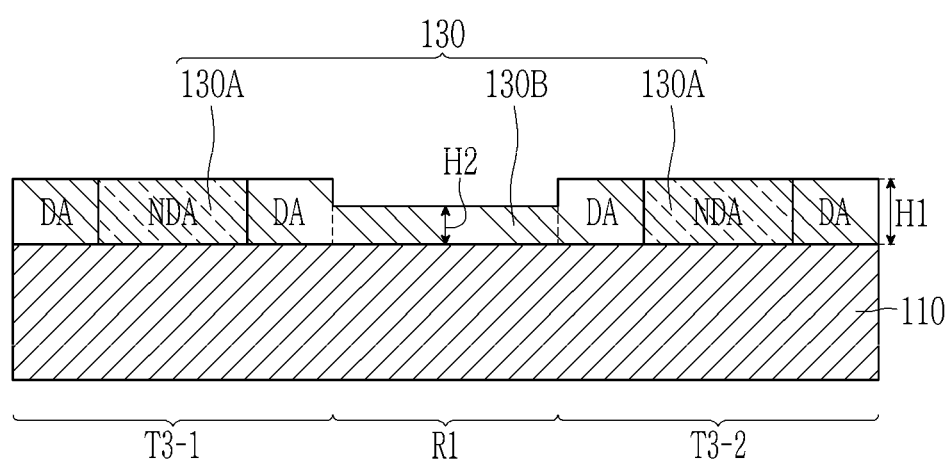
FIG. 12 illustrates a partial area of a semiconductor layer in the display device according to the embodiment of FIG. 11.

FIG. 11 illustrates an equivalent circuit diagram of a pixel in a display device according to another embodiment. FIG. 12 illustrates a partial area of the semiconductor layer 130 in the display device according to the embodiment of FIG. 11.

Referring to FIG. 11, the display device according to the present embodiment is the same as that of FIG. 1 except that the position of the first resistor R1 is disposed between the (3-1)-th transistor T3-1 and the (3-2)-th transistor T3-2. Detailed description of the same constituent elements will be omitted. Referring to FIG. 11, in the present embodiment, the first resistor R1 is positioned between the (3-1)-th transistor T3-1 and the (3-2)-th transistor T3-2. As described above, the first resistor R1 means a portion in which the thickness of the semiconductor layer 130 is thinner than that of other portions thereof. In this case, as in FIG. 1, since the amount of leakage current flowing through the third transistor T3 to the gate electrode of the driving transistor T1 may be reduced, the flicker may be prevented from being viewed during low frequency driving.

FIG. 12 briefly illustrates the semiconductor layer 130 of the (3-1)-th transistor T3-1 and the (3-2)-th transistor T3-2 with respect to the embodiment of FIG. 11. A doping area DA and a non-doping area NDA of each transistor are separately illustrated in FIG. 12. The doping area DA is an area in which doping has been made in the semiconductor layer 130 as shown in FIG. 5, and the non-doping area NDA is an area that is not doped because it is covered by a gate electrode or the like during the doping process, and functions as a channel of each transistor.

Referring to FIG. 12, the semiconductor layer 130 according to the present embodiment has a thin thickness in the area disposed between the (3-1)-th transistor T3-1 and the (3-2)-th transistor T3-2. That is, the semiconductor layer 130 includes the first area 130A having the first thickness H1 and the second area 130B having the second thickness H2. The (3-2)-th transistor T3-1 and the (3-2)-th transistor T3-2 are positioned in first area 130A, and the second area 130B is positioned between the (3-1)-th transistor T3-1 and the (3-2)-th transistor T3-2. The second area 130B having the thin thickness in FIG. 12 is an area corresponding to the first resistor R1 in FIG. 11, and the amount of leakage current may be reduced by the same principle as described above. In this case, the first thickness H1 may be 400 Å to 500 Å, and the second thickness H2 may be 300 Å to 400 Å.

Figure 13:
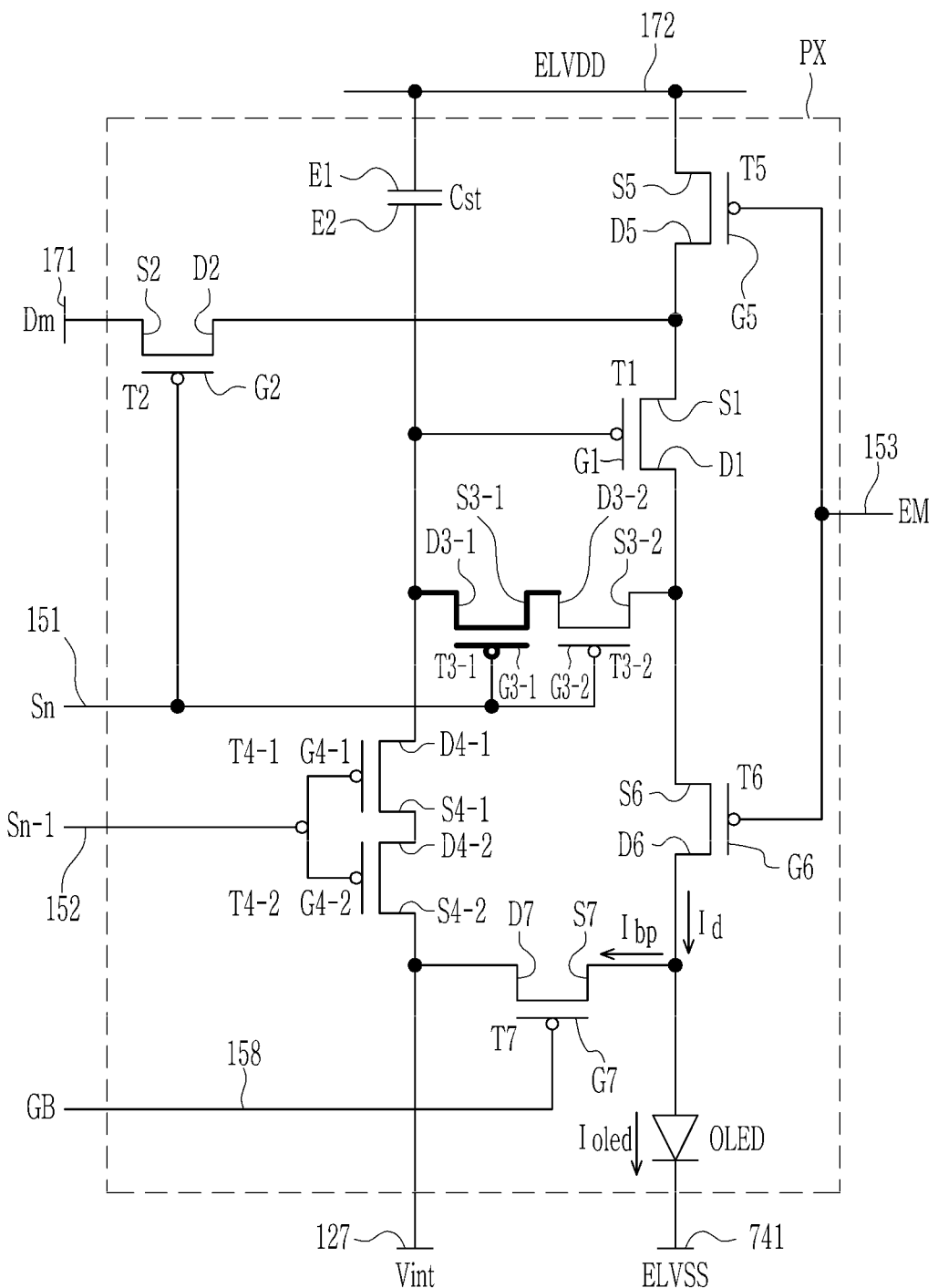
FIG. 13 illustrates an equivalent circuit diagram of a pixel in a display device according to another embodiment.
Figure 14:
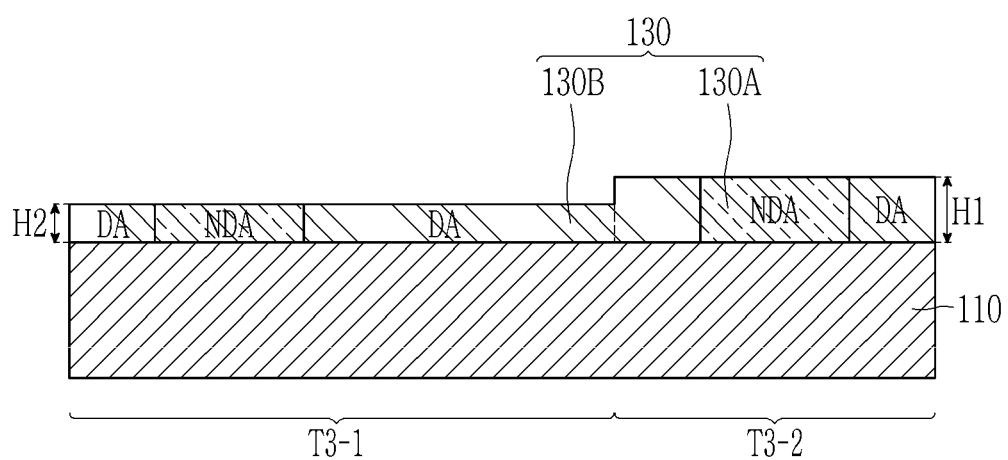
FIG. 14 illustrates a partial area of a semiconductor layer in the display device according to the embodiment of FIG. 13.

FIG. 13 illustrates an equivalent circuit diagram of a pixel in a display device according to another embodiment. FIG. 14 illustrates a partial area of the semiconductor layer 130 in the display device according to the embodiment of FIG. 13.

Referring to FIG. 13, in the display device according to the present embodiment, the thickness of the semiconductor layer 130 of the (3-1)-th transistor T3-1 is thinner than the thickness of the semiconductor layer 130 of the (3-2)-th transistor T3-2. In FIG. 13, the area having the thin thickness of the semiconductor layer 130 is illustrated by a thick line. The embodiment of FIG. 13 is the same as that of FIG. 1 except that the thickness of the semiconductor layer 130 of the (3-1)-th transistor T3-1 is thinner than the thickness of the semiconductor layer 130 of the (3-2)-th transistor T3-2. Detailed description of the same constituent elements will be omitted. Even when the thickness of the semiconductor layer 130 of the (3-1)-th transistor T3-1 is reduced in this way, as described above, since the amount of leakage current flowing through the third transistor T3 to the gate electrode of the driving transistor T1 may be reduced, the flicker may be prevented from being viewed during low frequency driving.

FIG. 14 briefly illustrates the semiconductor layer 130 of the (3-1)-th transistor T3-1 and the (3-2)-th transistor T3-2 with respect to the embodiment of FIG. 13. Referring to FIG. 14, the thickness of the semiconductor layer 130 in the (3-1)-th transistor T3-1 according to the present embodiment is thinner than the thickness of the semiconductor layer 130 in the (3-2)-th transistor T3-2. That is, the semiconductor layer 130 includes the first area 130A having the first thickness H1 and the second area 130B having the second thickness H2. The (3-2)-th transistor T3-2 is positioned in the first area 130A, and the (3-1)-th transistor T3-1 is positioned in the second area 130B. The (3-1)-th transistor T3-1 with the thin thickness may reduce the amount of leakage current according to the same principle as described above. In this case, the first thickness H1 may be 400 Å to 500 Å, and the second thickness H2 may be 300 Å to 400 Å.

Figure 15:
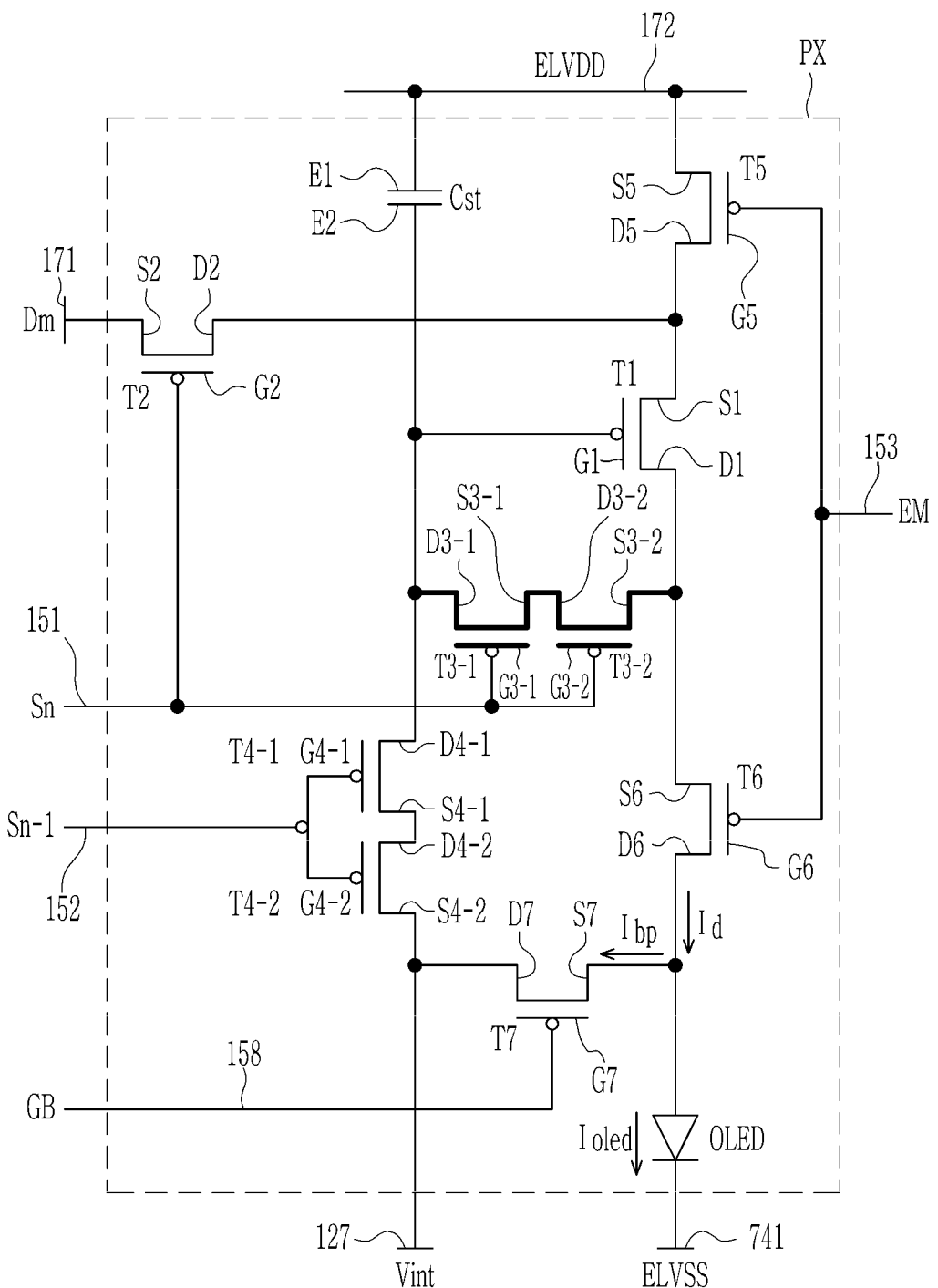
FIG. 15 illustrates an equivalent circuit diagram of a pixel in a display device according to another embodiment.
Figure 16:
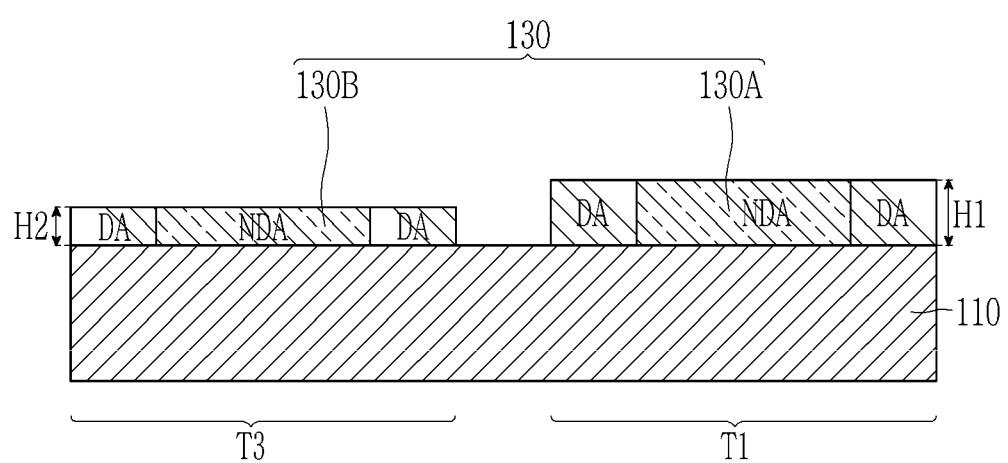
FIG. 16 illustrates a partial area of a semiconductor layer in the display device according to the embodiment of FIG. 15.

FIG. 15 illustrates an equivalent circuit diagram of a pixel in a display device according to another embodiment. FIG. 16 illustrates a partial area of the semiconductor layer 130 in the display device according to the embodiment of FIG. 15.

Referring to FIG. 15, in the display device according to the present embodiment, the thicknesses of the semiconductor layer 130 in the (3-1)-th transistor T3-1 and the (3-2)-th transistor T3-2 are thinner than those of the other transistors, for example, that of the driving transistor T1. In FIG. 13, the area having the thin thickness of the semiconductor layer 130 is illustrated by a thick line. The embodiment of FIG. 15 is the same as that of FIG. 1 except that the thicknesses of the semiconductor layer 130 of the (3-1)-th transistor T3-1 and the (3-2)-th transistor T3-2 are thinner than the thickness of the driving transistor T1. Detailed description of the same constituent elements will be omitted. Even when the thicknesses of the semiconductor layer 130 of the (3-1)-th transistor T3-1 and the (3-2)-th transistor T3-2 are reduced in this way, as described above, since the amount of leakage current flowing to the gate electrode of the driving transistor T1 through the (3-1)-th transistor T3-1 and the (3-2)-th transistor T3-2 may be reduced, the flicker may be prevented from being viewed during low frequency driving.

FIG. 16 briefly illustrates the semiconductor layer 130 of the (3-1)-th transistor T3-1 and the driving transistor T1 with respect to the embodiment of FIG. 15. Referring simultaneously to FIG. 15 and FIG. 16, the thickness of the semiconductor layer 130 of the compensation transistor T3, the (3-1)-th transistor T3-1 and the (3-2)-th transistor T3-2, according to the present embodiment is thinner than the thickness of the semiconductor layer 130 of the driving transistor T1. That is, the semiconductor layer 130 includes the first area 130A having the first thickness H1 and the second area 130B having the second thickness H2. The driving transistor T1 is positioned in the first area 130A, and the compensation transistor T3, the (3-1)-th transistor T3-1 and the (3-2)-th transistor T3-2, are positioned in the second area 130B. The compensation transistor T3, the (3-1)-th transistor T3-1 and the (3-2)-th transistor T3-2, that have the thin thickness of the semiconductor layer 130 may reduce the amount of leakage current according to the same principle as described above. In this case, the first thickness H1 may be 400 Å to 500 Å, and the second thickness H2 may be 300 Å to 400 Å.

Figure 17:
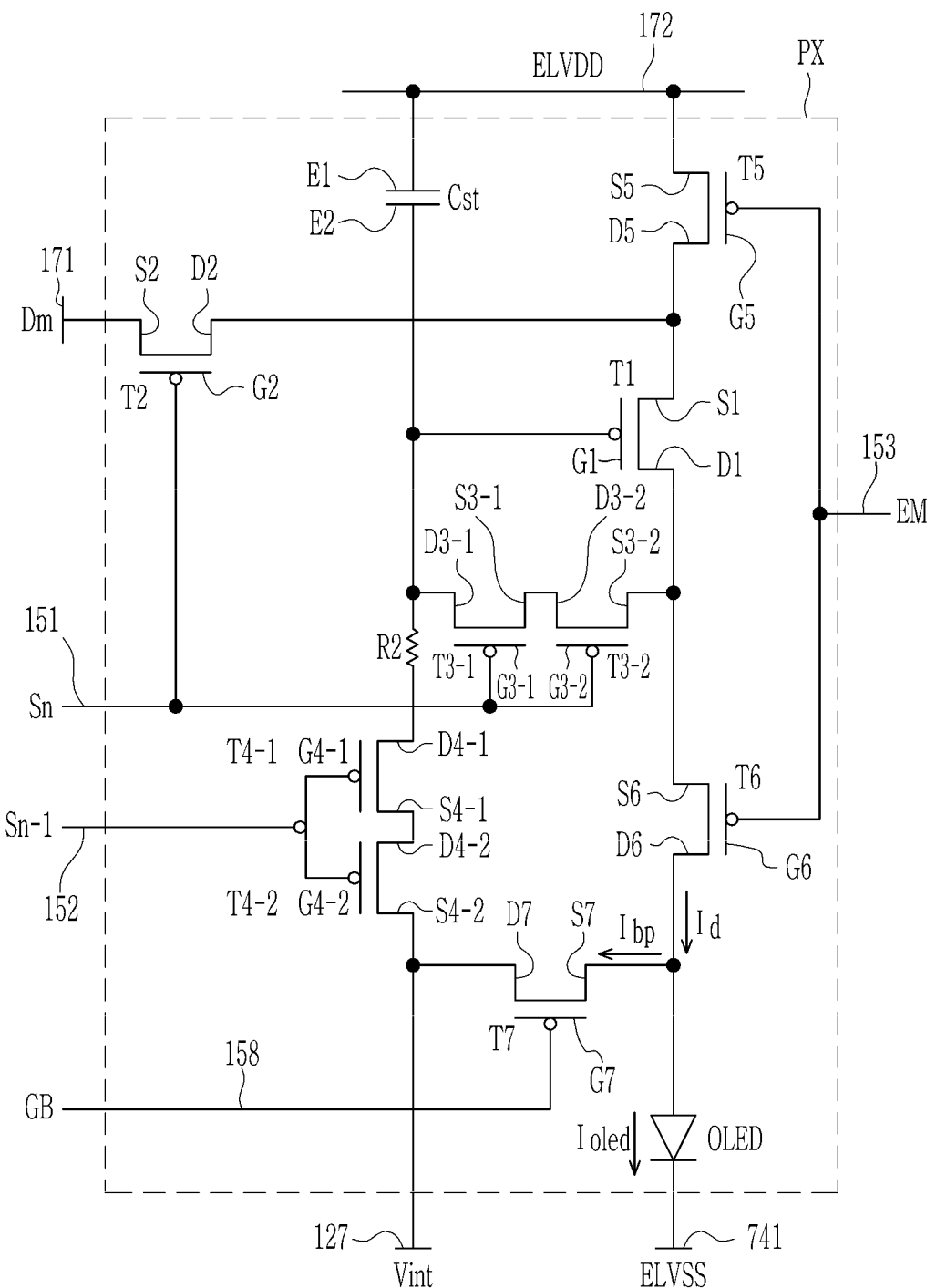
FIG. 17 illustrates an equivalent circuit diagram of a pixel in a display device according to another embodiment.

FIG. 17 illustrates an equivalent circuit diagram of a pixel in a display device according to another embodiment. FIG.

18 illustrates a partial area of the semiconductor layer 130 in the display device according to the embodiment of FIG. 17.

Referring to FIG. 17, the display device according to the present embodiment is the same as that of FIG. 1 except that the second resistor R2 is positioned between the fourth transistor T4 and the gate electrode of the driving transistor T1. Detailed description of the same constituent elements will be omitted. As described above, the second resistor R2 means a portion in which the thickness of the semiconductor layer 130 is thinner than that of other portions thereof. As shown in FIG. 17, even when the second resistor R2 is positioned between the fourth transistor T4 and the gate electrode G1 of the driving transistor T1, since the amount of leakage current through the fourth transistor T4 to the gate electrode G1 of the driving transistor T1 may be reduced, the flicker may be prevented from being viewed during low frequency driving.

Figure 18:
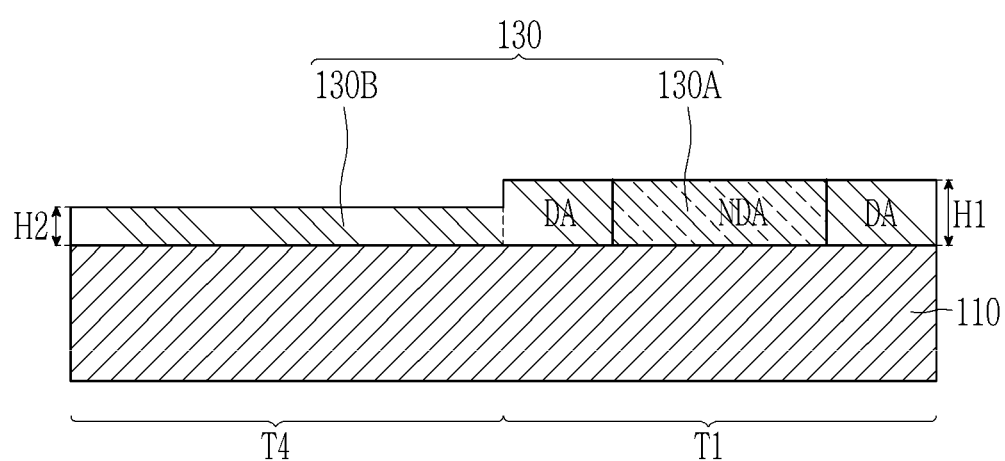
FIG. 18 illustrates a partial area of a semiconductor layer in the display device according to the embodiment of FIG. 17.

FIG. 18 schematically illustrates the fourth transistor T4, the (4-1)-th transistor T4-1 and the (4-2)-th transistor T4-2, and the semiconductor layer 130 therearound with respect to the embodiment of FIG. 17. Referring to FIG. 18, the semiconductor layer 130 according to the present embodiment includes the first area 130A having the first thickness H1 and the second area 130B having the second thickness H2. The first transistor T1 is positioned in the first area 130A, and the fourth transistor T4, the (4-1)-th transistor T4-1 and the (4-2)-th transistor T4-2, is positioned in the second area 130B as shown in FIG. 18. The second area 130B with such a thin thickness may reduce the amount of leakage current according to the same principle as described above. In this case, the first thickness H1 may be 400 Å to 500 Å, and the second thickness H2 may be 300 Å to 400 Å.

Figure 19:
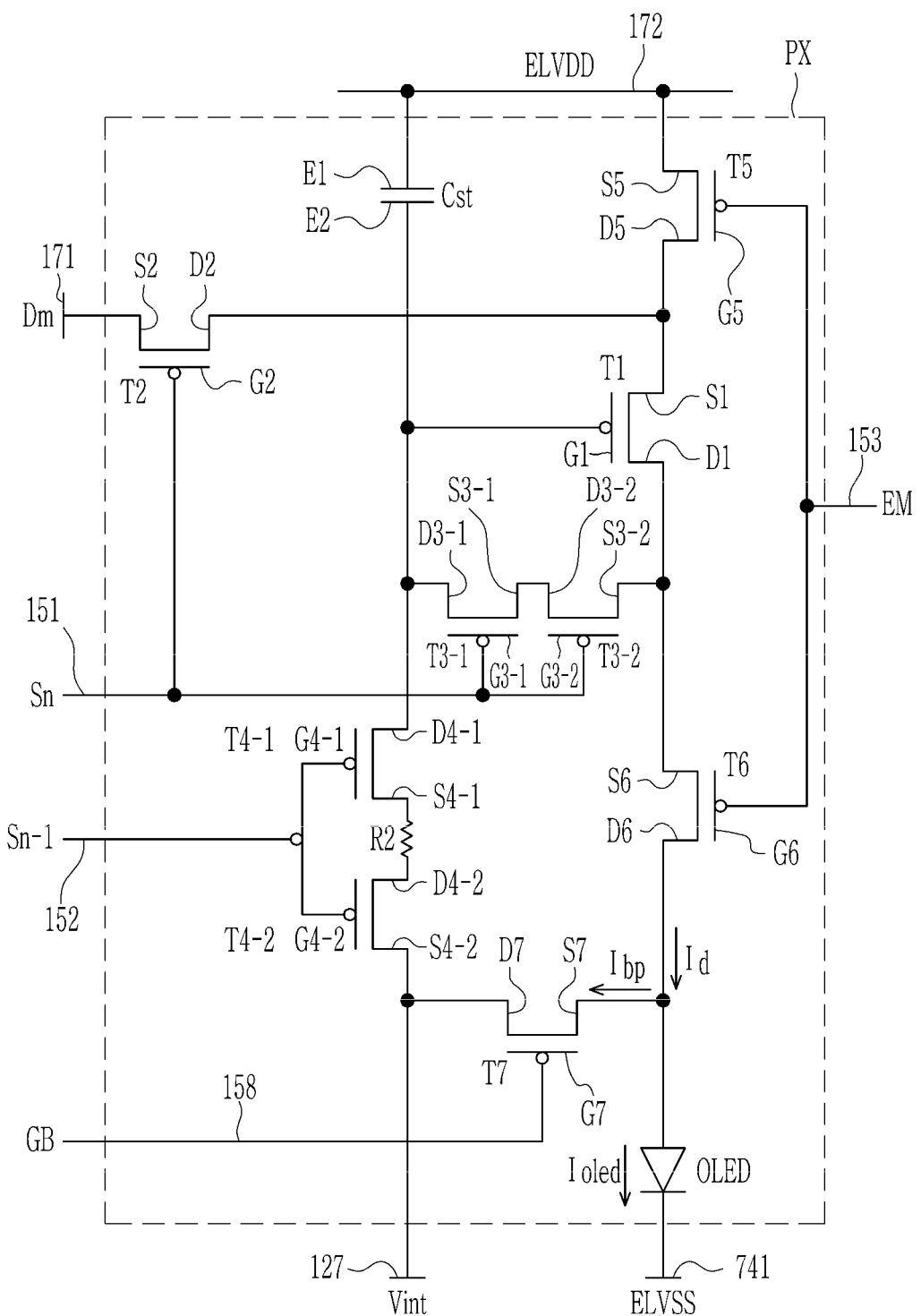
FIG. 19 illustrates an equivalent circuit diagram of a pixel in a display device according to another embodiment.
Figure 20:
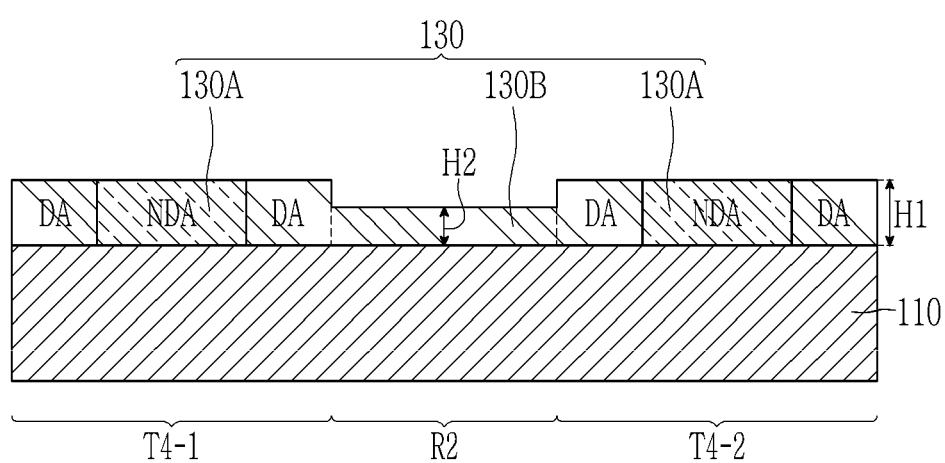
FIG. 20 illustrates a partial area of a semiconductor layer in the display device according to the embodiment of FIG. 19.

FIG. 19 illustrates an equivalent circuit diagram of a pixel in a display device according to another embodiment. FIG. 20 illustrates a partial area of the semiconductor layer 130 in the display device according to the embodiment of FIG. 19.

Referring to FIG. 19, the display device according to the present embodiment is the same as that of FIG. 17 except that the position of the second resistor R2 is disposed between the (4-1)-th transistor T4-1 and the (4-2)-th transistor T4-2. Detailed description of the same constituent elements will be omitted. Referring to FIG. 19, in the present embodiment, the second resistor R2 is positioned between the (4-1)-th transistor T4-1 and the (4-2)-th transistor T4-2. As described above, the second resistor R2 means a portion in which the thickness of the semiconductor layer 130 is thinner than that of other portions thereof. In this case, as in FIG. 17, since the amount of leakage current flowing through the fourth transistor T4 to the gate electrode of the driving transistor T1 may be reduced, the flicker may be prevented from being viewed during low frequency driving.

FIG. 20 briefly illustrates the semiconductor layer 130 of the (4-1)-th transistor T4-1 and the (4-2)-th transistor T4-2 with respect to the embodiment of FIG. 19. Referring to FIG. 20, the semiconductor layer 130 according to the present embodiment has a thin thickness in the area between the (4-1)-th transistor T4-1 and the (4-2)-th transistor T4-2. That is, the semiconductor layer 130 includes the first area 130A having the first thickness H1 and the second area 130B having the second thickness H2. The (4-1)-th transistor T4-1 and the (4-2)-th transistor T4-2 are positioned in first area 130A, and second area 130B is positioned between the (4-1)-th transistor T4-1 and the (4-2)-th transistor T4-2. The second area 130B having the thin thickness in FIG. 20 is an area corresponding to the second resistor R2 in FIG. 19, and the amount of leakage current may be reduced by the same principle as described above. In this case, the first thickness H1 may be 400 Å to 500 Å, and the second thickness H2 may be 300 Å to 400 Å.

Figure 21:
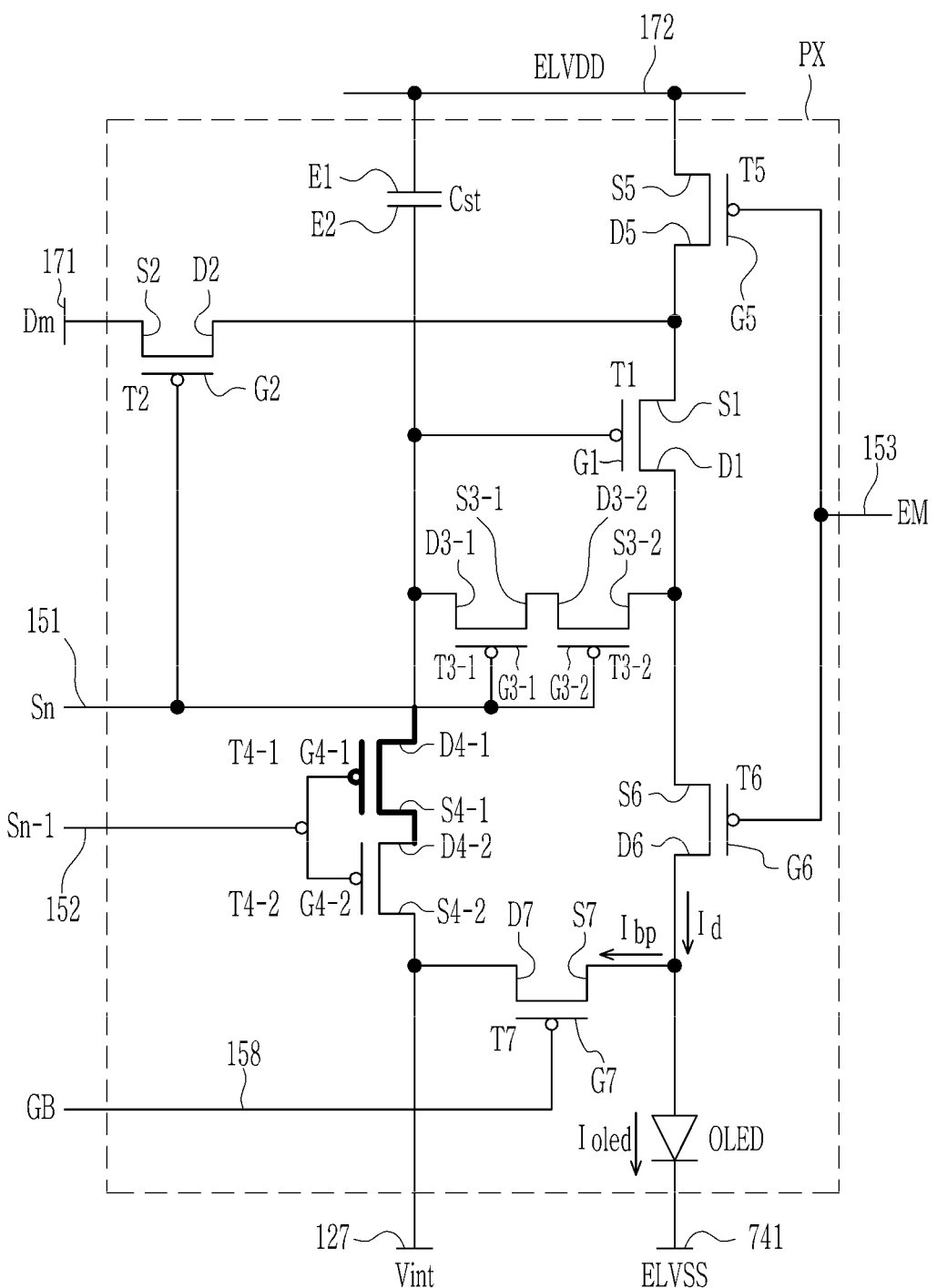
FIG. 21 illustrates an equivalent circuit diagram of a pixel in a display device according to another embodiment.
Figure 22:
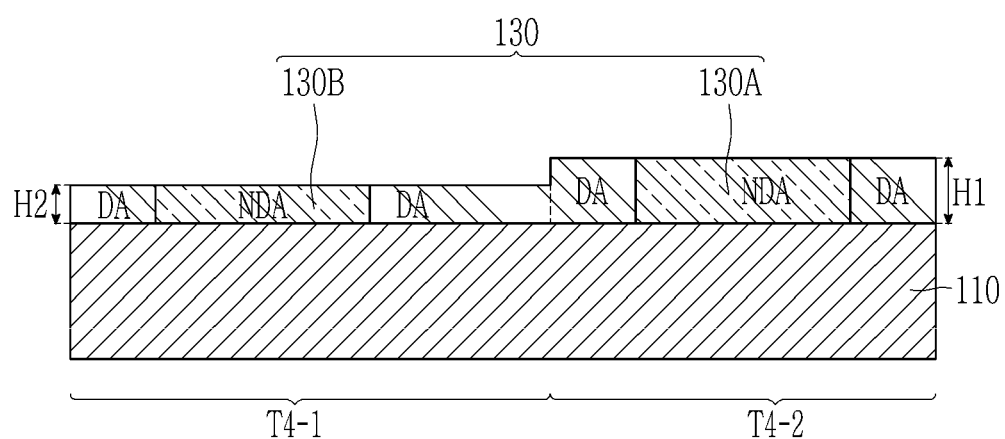
FIG. 22 illustrates a partial area of a semiconductor layer in the display device according to the embodiment of FIG. 21.

FIG. 21 illustrates an equivalent circuit diagram of a pixel in a display device according to another embodiment. FIG. 22 illustrates a partial area of the semiconductor layer 130 in the display device according to the embodiment of FIG. 21.

Referring to FIG. 21, in the display device according to the present embodiment, the thickness of the fourth transistor T4, the (4-1)-th transistor T4-1 and the (4-2)-th transistor T4-2, the (4-1)-th transistor T4-1 is thinner than the thickness of the (4-2)-th transistor T4-2. In FIG. 21, the area having the thin thickness of the semiconductor layer 130 is illustrated by a thick line. The embodiment of FIG. 21 is the same as that of FIG. 17 except that the thickness of the semiconductor layer 130 of the (4-1)-th transistor T4-1 is thinner than the thickness of the semiconductor layer 130 of the (4-2)-th transistor T4-2. Detailed description of the same constituent elements will be omitted. Even when the thickness of the semiconductor layer 130 of the (4-1)-th transistor T4-1 is reduced in this way, as described above, since the amount of leakage current flowing through the (4-1)-th transistor T4-1 to the gate electrode of the driving transistor T1 may be reduced, the flicker may be prevented from being viewed during low frequency driving.

FIG. 22 briefly illustrates the semiconductor layer 130 of the (4-1)-th transistor T4-1 and the (4-2)-th transistor T4-2 with respect to the embodiment of FIG. 21. Referring to FIG. 22, the thickness of the semiconductor layer 130 of the (4-1)-th transistor T4-1 according to the present embodiment is thinner than the thickness of the semiconductor layer 130 of the (4-2)-th transistor T4-2. That is, the semiconductor layer 130 includes the first area 130A having the first thickness H1 and the second area 130B having the second thickness H2. The (4-2)-th transistor T4-2 is positioned in the first area 130A, and the (4-1)-th transistor T4-1 is positioned in the second area 130B. The (4-1)-th transistor T4-1 with the thin thickness may reduce the amount of leakage current according to the same principle as described above. In this case, the first thickness H1 may be 400 Å to 500 Å, and the second thickness H2 may be 300 Å to 400 Å.

Figure 23:
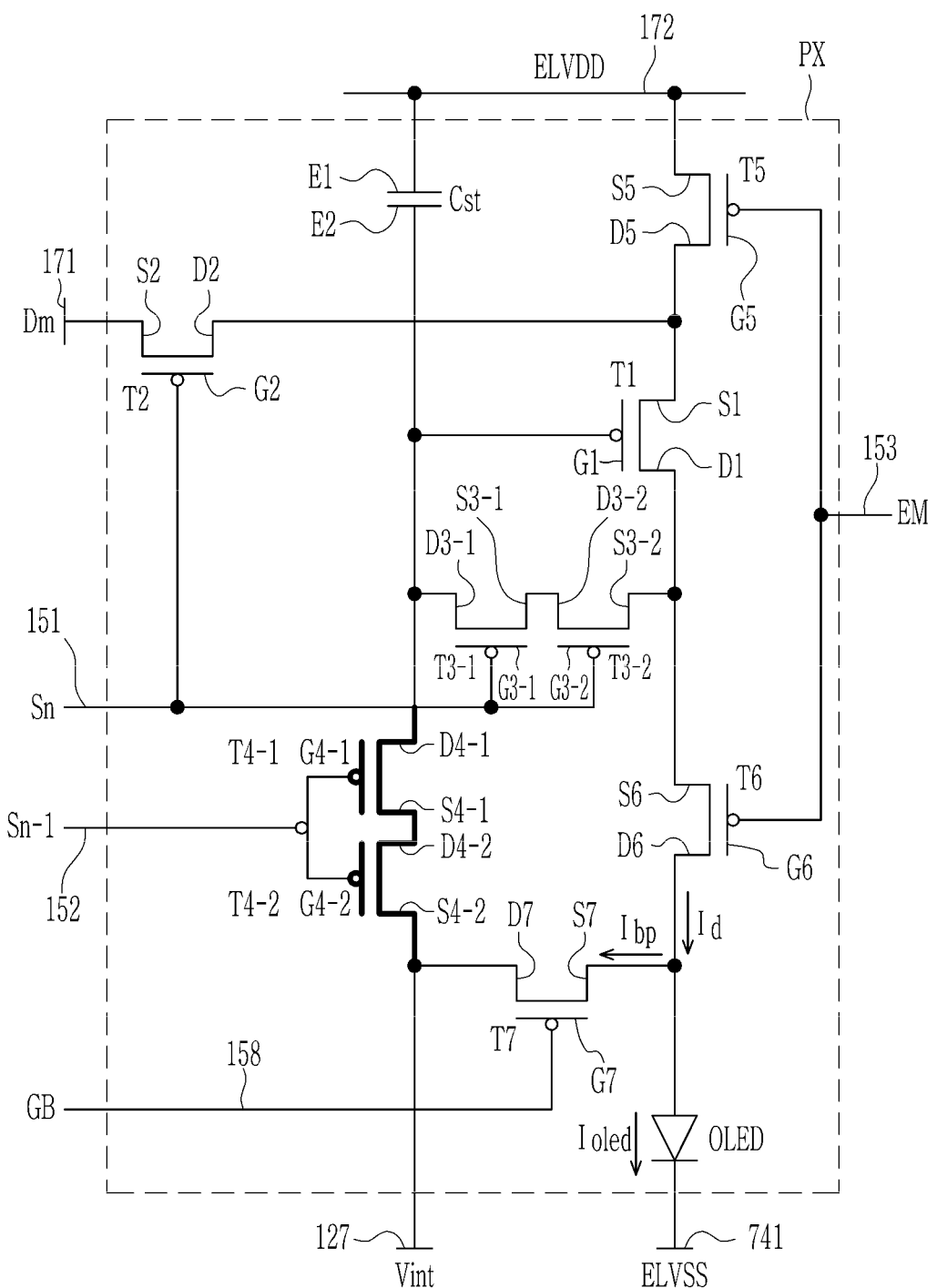
FIG. 23 illustrates an equivalent circuit diagram of a pixel in a display device according to another embodiment.
Figure 24:
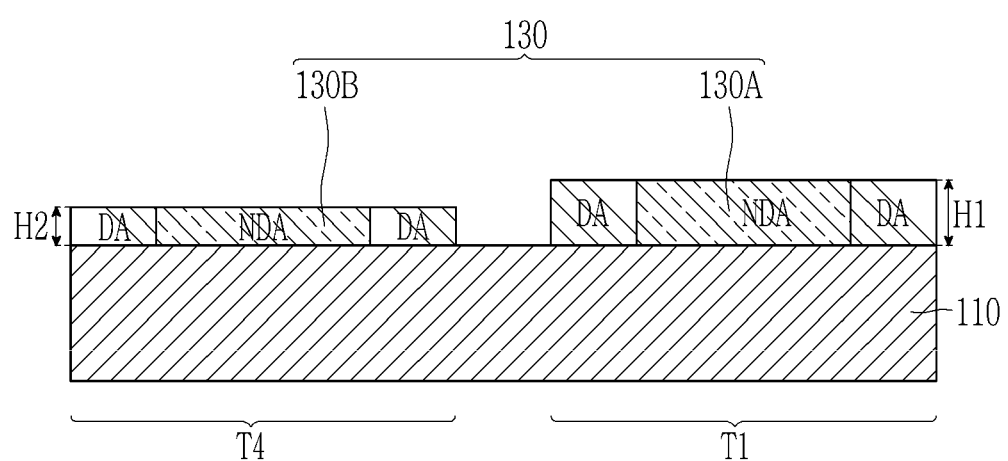
FIG. 24 illustrates a partial area of a semiconductor layer in the display device according to the embodiment of FIG. 15.

FIG. 23 illustrates an equivalent circuit diagram of a pixel in a display device according to another embodiment. FIG. 24 illustrates a partial area of the semiconductor layer 130 in the display device according to the embodiment of FIG. 15.

Referring to FIG. 23, in the display device according to the present embodiment, the thicknesses of the semiconductor layer 130 of the (4-1)-th transistor T4-1 and the (4-2)-th transistor T4-2 are thinner than those of the other transistors, for example, that of the driving transistor T1. In FIG. 23, the area having the thin thickness of the semiconductor layer 130 is illustrated by a thick line. The embodiment of FIG. 23 is the same as that of FIG. 17 except that the thicknesses of the semiconductor layer 130 of the (4-1)-th transistor T4-1 and the (4-2)-th transistor T4-2 are thinner than the thickness of the driving transistor T1. Detailed description of the same constituent elements will be omitted. Even when the thicknesses of the semiconductor layer 130 of the (4-1)-th transistor T4-1 and the (4-2)-th transistor T4-2 are reduced in this way, as described above, since the amount of leakage current flowing through the (4-1)-th transistor T4-1 and the (4-2)-th transistor T4-2 to the gate electrode of the driving transistor T1 may be reduced, the flicker may be prevented from being viewed during low frequency driving.

FIG. 24 briefly illustrates the semiconductor layer 130 of the (4-1)-th transistor T4-1 and the driving transistor T1 with respect to the embodiment of FIG. 23. Referring simultaneously to FIG. 23 and FIG. 24, the thickness of the semiconductor layer 130 of the (4-1)-th transistor T4-1 and the (4-2)-th transistor T4-2 according to the present embodiment is thinner than the thickness of the semiconductor layer 130 of the driving transistor T1. That is, the semiconductor layer 130 includes the first area 130A having the first thickness H1 and the second area 130B having the second thickness H2. The driving transistor T1 is positioned in the first area 130A, and the (4-1)-th transistor T4-1 and the (4-2)-th transistor T4-2 are positioned in the second area 130B. The (4-1)-th transistor T4-1 and the (4-2)-th transistor T3-2 that have the thin thickness of the semiconductor layer 130 may reduce the amount of leakage current according to the same principle as described above. In this case, the first thickness H1 may be 400 Å to 500 Å, and the second thickness H2 may be 300 Å to 400 Å.

Figure 25:
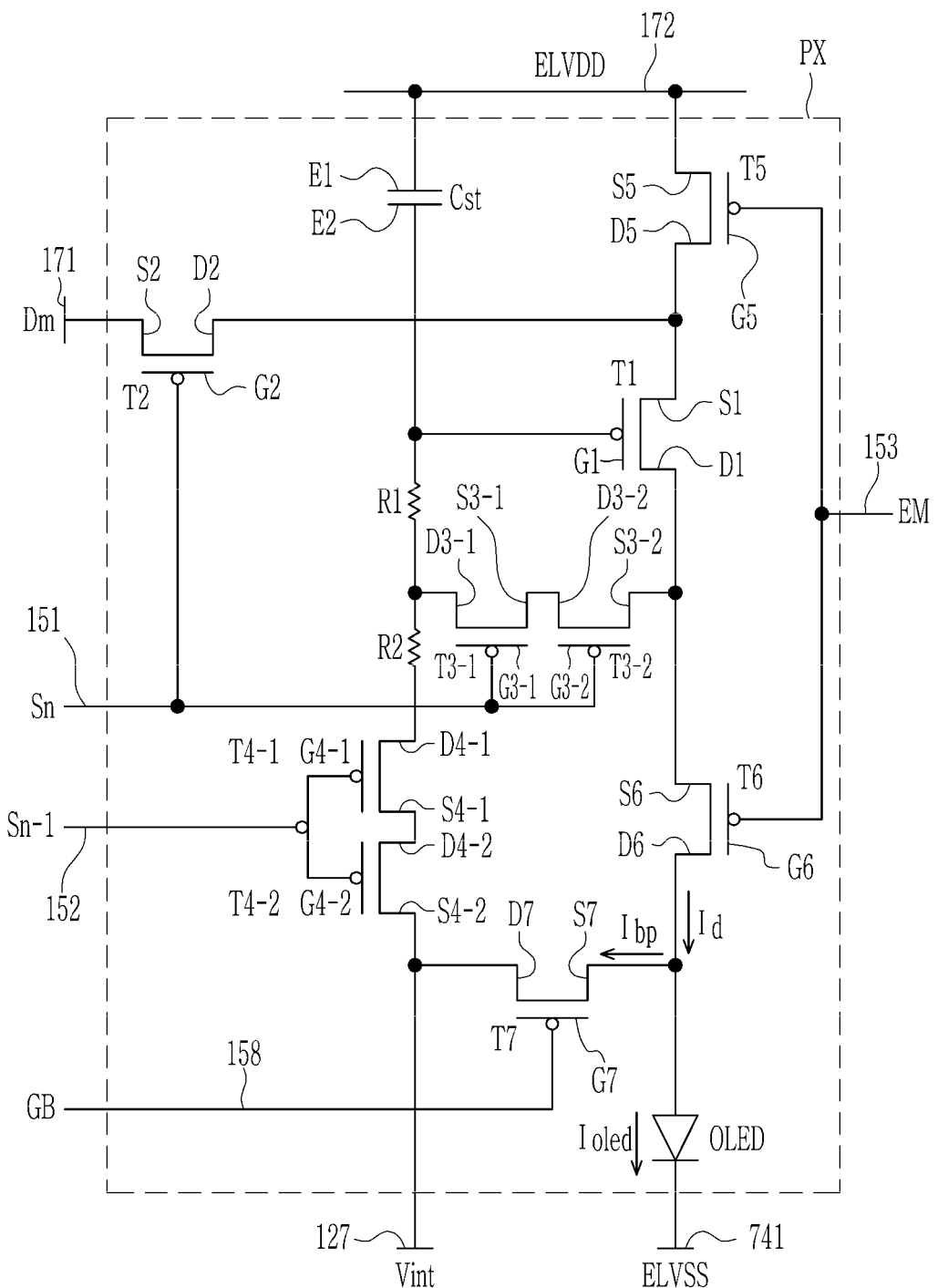
FIGS. 25, 26, 27 and 28 illustrate an equivalent circuit diagram of a pixel in a display device according to another embodiment.

FIG. 25 illustrates an equivalent circuit diagram of a pixel in a display device according to another embodiment. Referring to FIG. 25, the display device according to the present embodiment is the same as the embodiment of FIG. 1 except that the first resistor R1 is positioned between the third transistor T3 and the gate electrode G1 of the driving transistor T1 and the second resistor R2 is positioned between the fourth transistor T4 and the gate electrode G1 of the driving transistor T1. Detailed description of the same constituent elements will be omitted. In the case of FIG. 25, since both the first resistor R1 and the second resistor R2 are included, the leakage current may be more effectively reduced.

Figure 26:
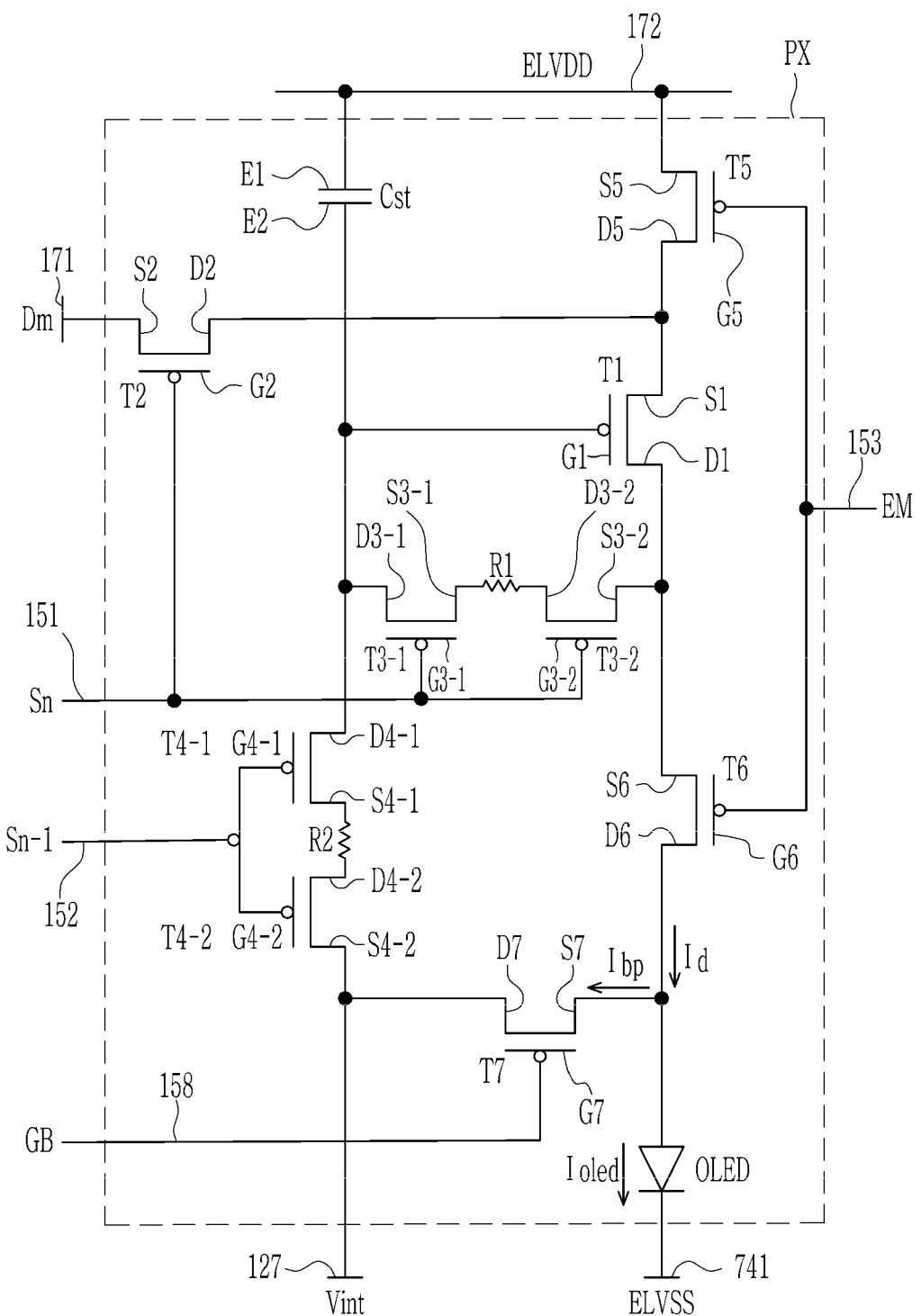

FIG. 26 illustrates an equivalent circuit diagram of a pixel in a display device according to another embodiment. The embodiment of FIG. 26 is the same as the embodiment of FIG. 11 except that the first resistor R1 is positioned between the (3-1)-th transistor T3-1 and the (3-2)-th transistor T3-2, and the second resistor R2 is positioned between the (4-1)-th transistor T4-1 and the (4-2)-th transistor T4-2. Detailed description of the same constituent elements will be omitted. In the case of FIG. 26, since both the first resistor R1 and the second resistor R2 are included, the leakage current may be more effectively reduced.

Figure 27:
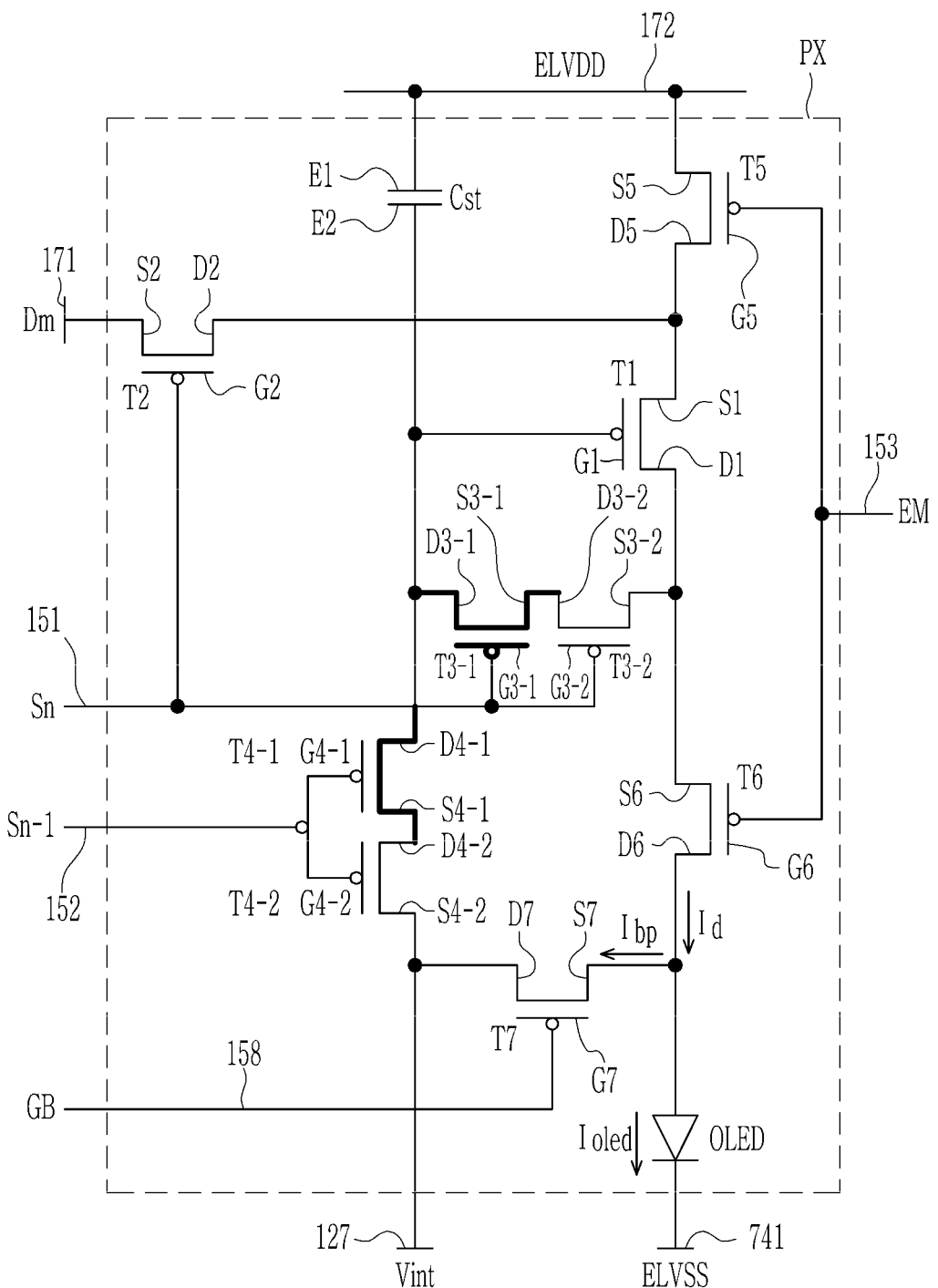

FIG. 27 illustrates an equivalent circuit diagram of a pixel in a display device according to another embodiment. The embodiment of FIG. 27 is the same as the embodiment of FIG. 13 except that the thickness of the semiconductor layer 130 of the (3-1)-th transistor T3-1 is thinner than the thickness of the semiconductor layer 130 of the (3-2)-th transistor T3-2, and the thickness of the semiconductor layer 130 of the (4-1)-th transistor T4-1 is thinner than the thickness of the semiconductor layer 130 of the (4-2)-th transistor T4-2. In the case of FIG. 27, since there are two transistors having a thinner semiconductor layer 130, the leakage current may be more effectively reduced.

Figure 28:
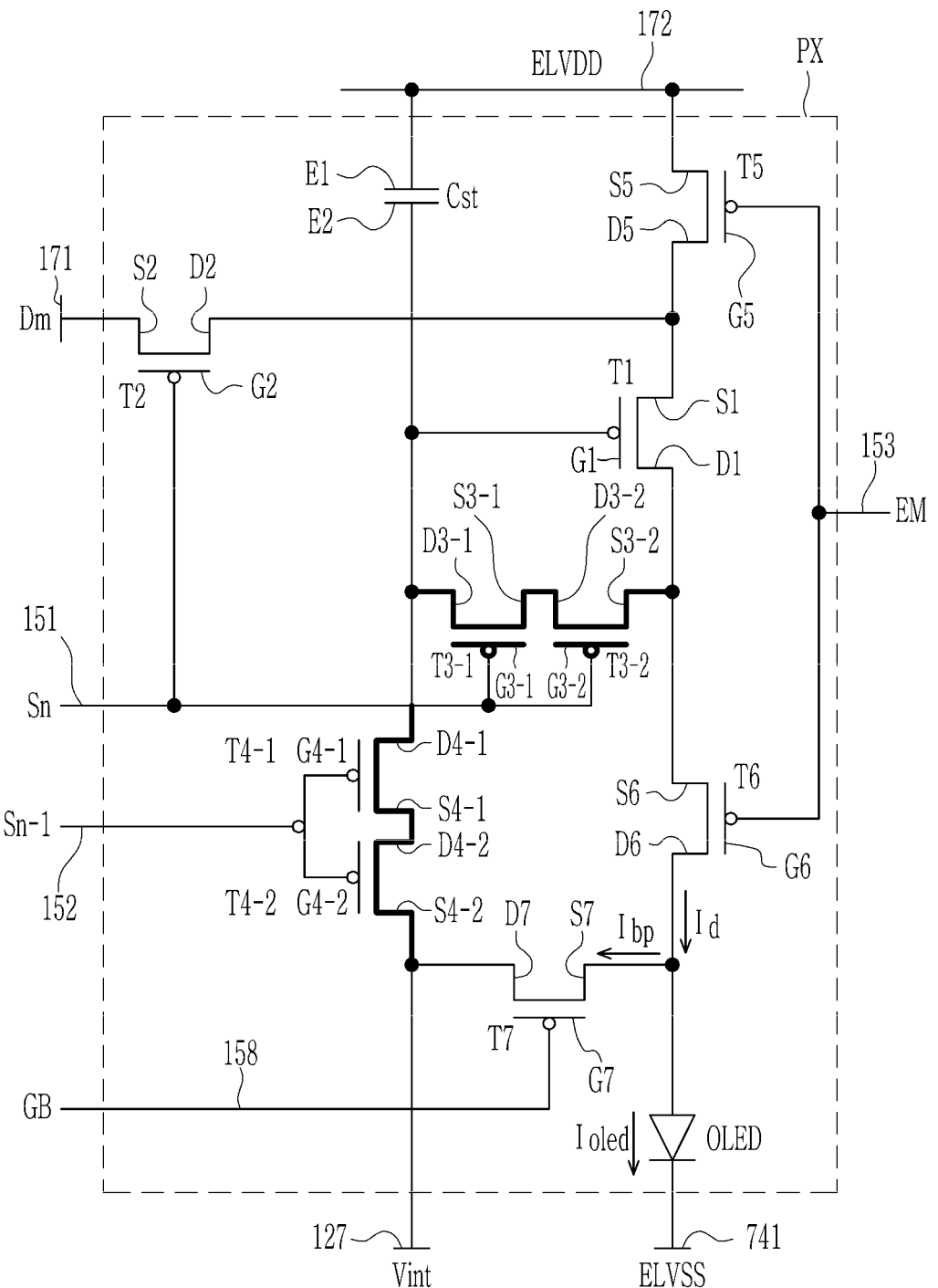

FIG. 28 illustrates an equivalent circuit diagram of a pixel in a display device according to another embodiment. The embodiment of FIG. 28 is the same as the embodiment of FIG. 15 except that the thicknesses of the (3-1)-th transistor T3-1, the (3-2)-th transistor T3-2, the (4-1)-th transistor T4-1, and the (4-2)-th transistor T4-2 are thinner than those of other transistors, for example that of the driving transistor T1. In the case of FIG. 28, since there are four transistors having the thinner semiconductor layer 130, the leakage current may be more effectively reduced.

Although FIG. 1 to FIG. 28 illustrate the configuration in which the pixel circuit of the display device includes seven transistors and one capacitor, the structure of the pixel circuit may vary.

Figure 29:
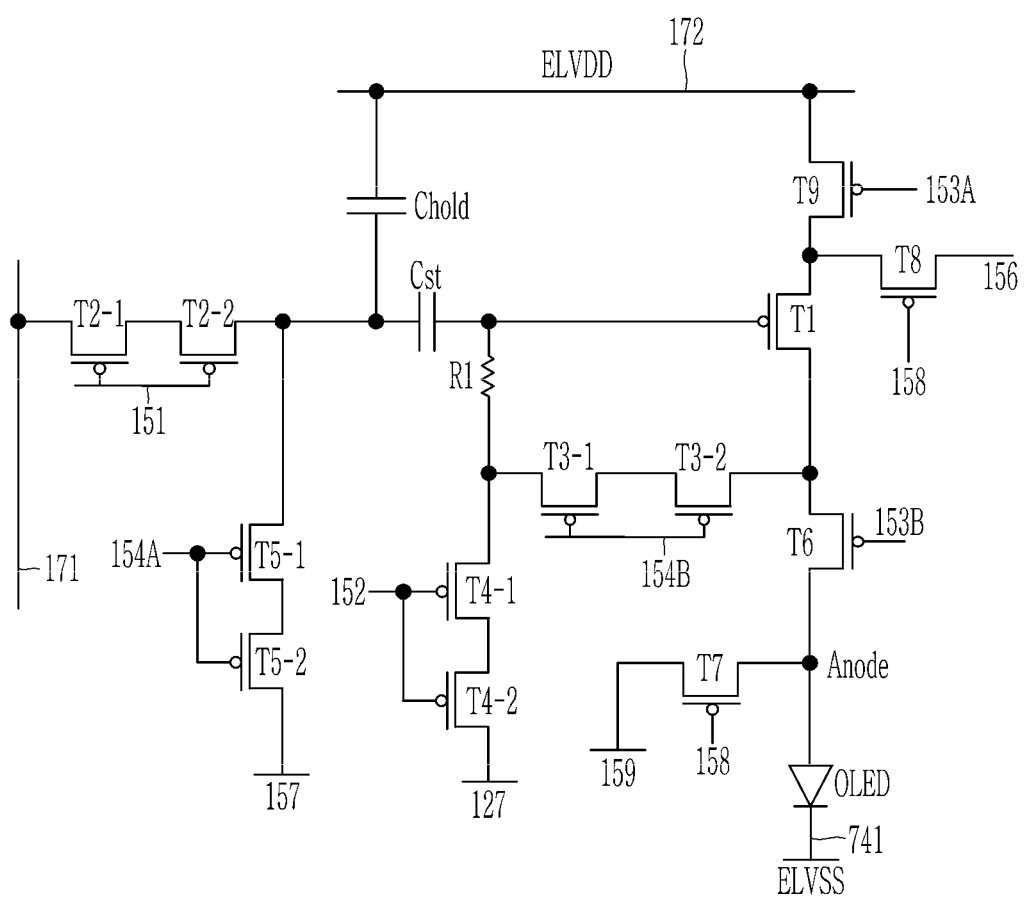
FIGS. 29, 30, 31, 32, 33, 34, 35, 36, 37, 38, 39, 40, 41, 42, 43 and 44 illustrate an equivalent circuit diagram of a pixel in a display device according to another embodiment.

FIG. 29 illustrates an equivalent circuit diagram of a pixel in a display device according to another embodiment. Referring to FIG. 29, the display device according to the present embodiment includes nine transistors T1, T2, T3, T4, T5, T6, T7, T8, and T9, two capacitors Cst and Chold, and a light emitting diode OLED.

A light emitting display device includes a display area in which an image is displayed, and pixels are arranged in various forms in the display area.

A plurality of signal lines include a reference voltage line 157, a 1A-th scan line 154A, a 1B-th scan line 154B, a scan line 151, a first light emitting control line 153A, a second light emitting control line 153B, and a previous scan line 152. An initializing voltage line 127, a bypass control line 158, a bias voltage line 156, an anode initializing voltage line 159, a data line 171, a driving voltage line 172, and a common voltage line 741 may be included.

First and second electrodes are positioned at respective sides of each of the transistors T1, T2, T3, T4, T5, T6, T7, T8, and T9. When one side of the transistor is the first electrode, the other side thereof becomes the second electrode.

The driving transistor T1 is a transistor that adjusts an amount of an output current according to the data voltage applied thereto. The output driving current is applied to the light emitting diode OLED to adjust the brightness of the light emitting diode OLED according to the data voltage. To this end, the first electrode of the driving transistor T1 may receive a driving voltage. The first electrode is connected to the driving voltage line 172 via the ninth transistor T9.

The first electrode of the driving transistor T1 receives a bias voltage through the eighth transistor T8, and maintains the first electrode voltage of the driving transistor T1 at a certain level.

The second electrode of the driving transistor T1 outputs a current toward the light emitting diode OLED. The second electrode of the driving transistor T1 is connected to the anode of the light emitting diode OLED via the sixth transistor T6. Meanwhile, the gate electrode G1 of the driving transistor T1 is connected to the storage capacitor Cst. Accordingly, a voltage of the gate electrode of the driving transistor T1 is changed according to a voltage stored in the storage capacitor Cst, and accordingly, an output current from the driving transistor T1 is changed.

The second transistor T2 is a transistor that transmits a data voltage to the pixel. The gate electrode of the second transistor T2 is connected to the scan line 151, the first electrode is connected to the data line 171, and the second electrode is connected to the storage capacitor Cst. When the second transistor T2 is turned on according to the scan signal transmitted through the scan line 151, the data voltage transmitted through the data line 171 is transmitted to the gate electrode of the driving transistor T1. The second transistor T2 may be formed with two transistors T2-1 and T3-2 serially connected to each other. The two transistors T2-1 and T2-2 are combined to serve as the second transistor T2.

The third transistor T3 serves to store a compensated data voltage which is a data voltage compensated for the threshold voltage of the driving transistor T1 in the storage capacitor Cst. The gate electrode of the third transistor T3 is connected to the 1B-th scan line 154B, the first electrode of the third transistor T3 is connected to the gate electrode of the driving transistor T1 and the storage capacitor Cst, and the second electrode thereof is connected to the second electrode of the driving transistor T1. That is, when the driving transistor T1 is diode-connected and the driving transistor T1 is turned on by the voltage stored in the storage capacitor Cst, the negative charge stored in the storage capacitor Cst is discharged and thus a voltage of a node connected to the gate electrode of the driving transistor T1 increases. Then, when the node connected to the gate electrode of the driving transistor T1 becomes the threshold voltage of the driving transistor T1, the driving transistor T1 is turned off and the voltage of the node connected to the gate electrode of the driving transistor T1 no longer increases, so the voltage stored in the storage capacitor Cst becomes the threshold voltage of the driving transistor T1. With this structure, driving transistors T1 have different threshold voltages may be compensate.

The gate electrode of the third transistor T3 is connected to the 1B-th scan line 154B, and the gate electrode of the second transistor T2 is connected to the scan line 151. Accordingly, since a data writing process of and a voltage compensating process of the pixel are performed at separate timings, high-speed driving is possible. That is, in the display device according to the present embodiment, a compensating operation in which the third transistor is turned on and a data writing operation in which the second transistor is turned on are separated. In the conventional display device including seven transistors and one capacitor, since the data writing and the compensating are simultaneously performed, one timing cannot be reduced below a certain level, and high-speed driving is difficult. However, the display device according to the present embodiment may be driven at a high speed.

The third transistor T3 may be formed with two transistors T3-1 and T3-2 serially connected to each other. The two transistors T3-1 and T3-2 are combined to serve as the third transistor T3.

The fourth transistor T4 serves to initialize the node connected to the gate electrode of the driving transistor T1 and the second storage electrode of the storage capacitor Cst. The gate electrode of the fourth transistor T4 is connected to the previous scan line 152, and the first electrode is connected to the initializing voltage line 127. The second electrode of the fourth transistor T4 is connected to the node connected to the second storage electrode of the storage capacitor Cst and the gate electrode of the driving transistor T1. The fourth transistor T4 transmits the initializing voltage to the gate electrode of the driving transistor T1 and the storage capacitor Cst according to the signal received through the previous scan line 152. Accordingly, a gate voltage of the gate electrode of the driving transistor T1 and the storage capacitor Cst are initialized. The initializing voltage may have a low voltage value, and it may be a voltage capable of turning on the driving transistor T1. The fourth transistor T4 may be formed with two transistors T4-1 and T4-2 serially connected to each other. The two transistors T4-1 and T4-2 are combined to serve as the fourth transistor T4.

The gate electrode of the fifth transistor T5 is connected to the 1A-th scan line 154A, the first electrode thereof is connected to the reference voltage line 157, and the second electrode thereof is connected to the first electrode of the input capacitor Chold and the second electrode of the second transistor T2. The fifth transistor T5 serves to initialize the voltage of the first electrode of the input capacitor Chold (or the second electrode of the second transistor T2) to a reference voltage. The fifth transistor T5 may be formed with two transistors T5-1 and T5-2 serially connected to each other. The two transistors T5-1 and T5-2 are combined to serve as the fifth transistor T5.

The sixth transistor T6 serves to transmit a driving current outputted from the driving transistor T1 to the light emitting diode OLED. The gate electrode thereof is connected to the second light emitting control line 153B, and the first electrode thereof is connected to the second electrode of the driving transistor T1. The second electrode of the sixth transistor T6 is connected to the anode of the light emitting diode OLED.

The seventh transistor T7 serves to initialize the anode of the light emitting diode OLED. The gate electrode thereof is connected to the bypass control line 158, the first electrode thereof is connected to the anode of the light emitting diode OLED, and the second electrode thereof is connected to the anode initializing voltage line 159. When the seventh transistor T7 is turned on according to the bypass signal, the anode initializing voltage is applied to the anode of the light emitting diode OLED such that the light emitting diode OLED is initialized.

The eighth transistor T8 serves to apply a bias voltage to the first electrode of the driving transistor T1 so that the voltage level of the first electrode of the driving transistor T1 does not deviate from a predetermined range. The gate electrode of the eighth transistor T8 is connected to the bypass control line 158, the first electrode of the eighth transistor T8 is connected to the bias voltage line 156, and the second electrode of the eighth transistor T8 is connected to the first electrode of the driving transistor T1.

The ninth transistor T9 serves to transmit the driving voltage to the driving transistor T1. The gate electrode thereof is connected to the first light emitting control line 153A, and the first electrode thereof is connected to the driving voltage line 172. The second electrode of the ninth transistor T9 is connected to the first electrode of the driving transistor T1.

The anode of the light emitting diode OLED is connected to the second electrode of the sixth transistor T6 and the first electrode of the seventh transistor T7, and the cathode thereof is connected to the common voltage line 741 that transmits the common voltage ELVSS.

Referring to FIG. 29, the display device according to the present embodiment includes the first resistor R1 positioned between the third transistor T3 and the gate electrode of the driving transistor T1. As described above, the first resistor R1 may be a thin portion of the semiconductor layer. The semiconductor layer with such a thin thickness may reduce the leakage current, and prevent the flicker from being viewed during low frequency driving. The specific leakage current reduction principle is the same as described above. That is, the dangling bond on a surface of the thin portion of the semiconductor layer is removed, so that the amount of leakage current is reduced, and as shown in FIG. 29, the thin portion of the semiconductor layer may function as the first resistor R1, which reduces the amount of leakage current flowing through the third transistor T3, thereby preventing the flicker from being viewed during low frequency driving.

Figure 30:
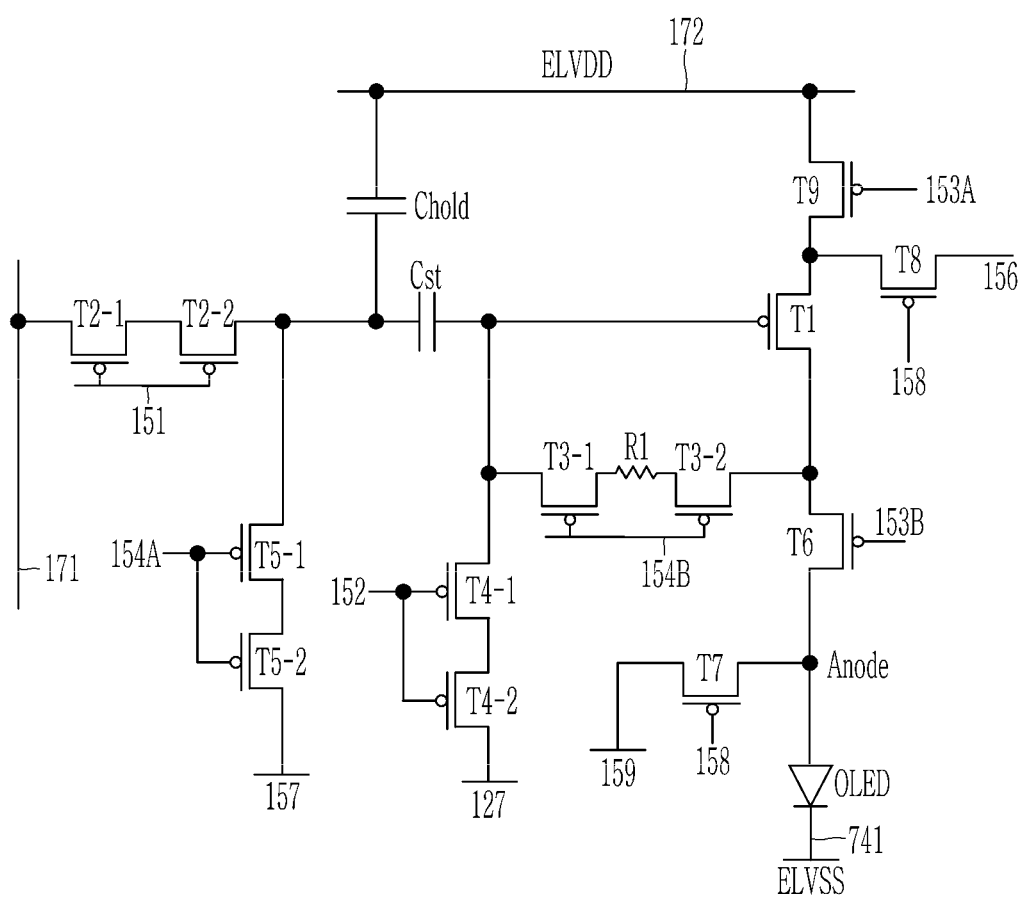

FIG. 30 illustrates an equivalent circuit diagram of a pixel for another embodiment. Referring to FIG. 30, the display device according to the present embodiment is the same as that of FIG. 29 except that the first resistor R1 is positioned between the (3-1)-th transistor T3-1 and the (3-2)-th transistor T3-2. Detailed description of the same constituent elements will be omitted. As described above, the first resistor R1 means a thin portion of the semiconductor layer. FIG. 30 shows that the leakage current is reduced by the first resistor R1 positioned between the (3-1)-th transistor T3-1 and the (3-2)-th transistor T3-2 and the flicker is prevented from being viewed during low frequency driving.

Figure 31:
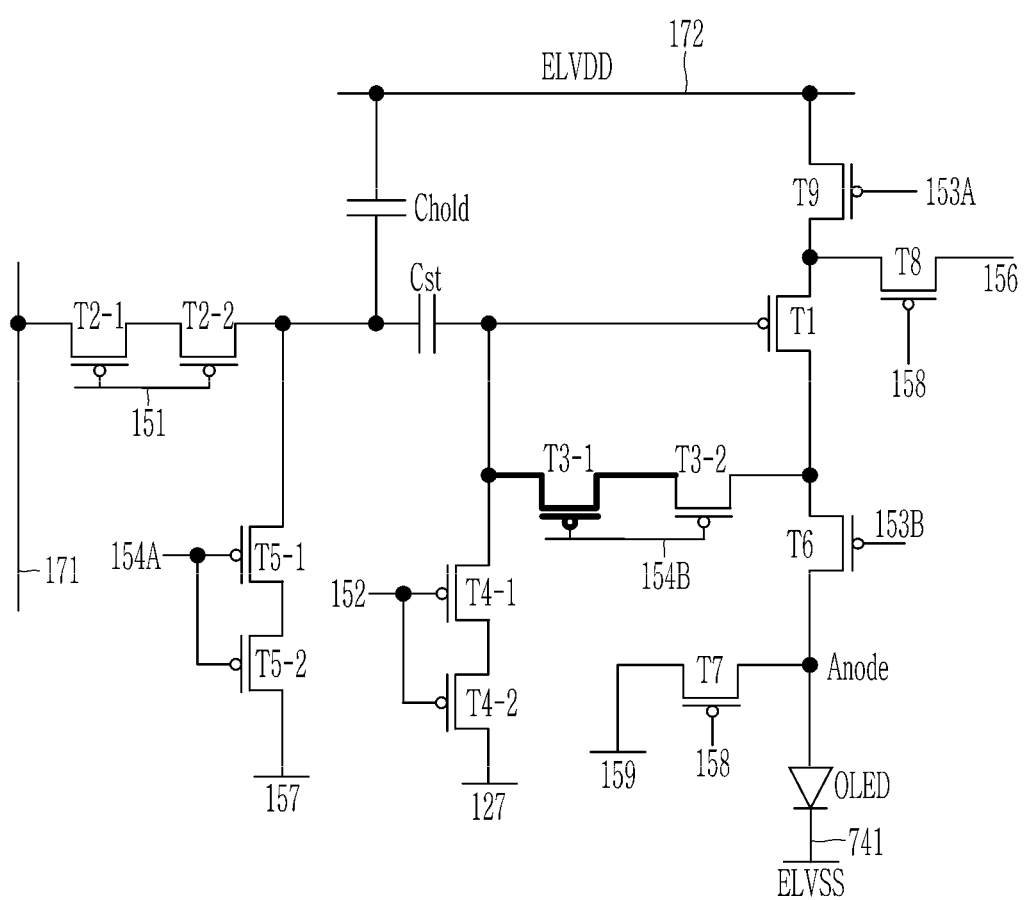

FIG. 31 illustrates an equivalent circuit diagram of a pixel for another embodiment. Referring to FIG. 31, the display device according to the present embodiment is the same as that of FIG. 29 except that the thickness of the semiconductor layer 130 of the (3-1)-th transistor T3-1 is thinner than the thickness of the semiconductor layer 130 of the (3-2)-th transistor T3-2. Detailed description of the same constituent elements will be omitted. In FIG. 31, the area having the thin thickness of the semiconductor layer is illustrated by a thick line. Even when the thickness of the semiconductor layer 130 of the (3-1)-th transistor T3-1 is reduced in this way, as described above, since the amount of leakage current flowing to the gate electrode of the driving transistor T1 through the (3-1)-th transistor T3-1 may be reduced, the flicker may be prevented from being viewed during low frequency driving.

Figure 32:
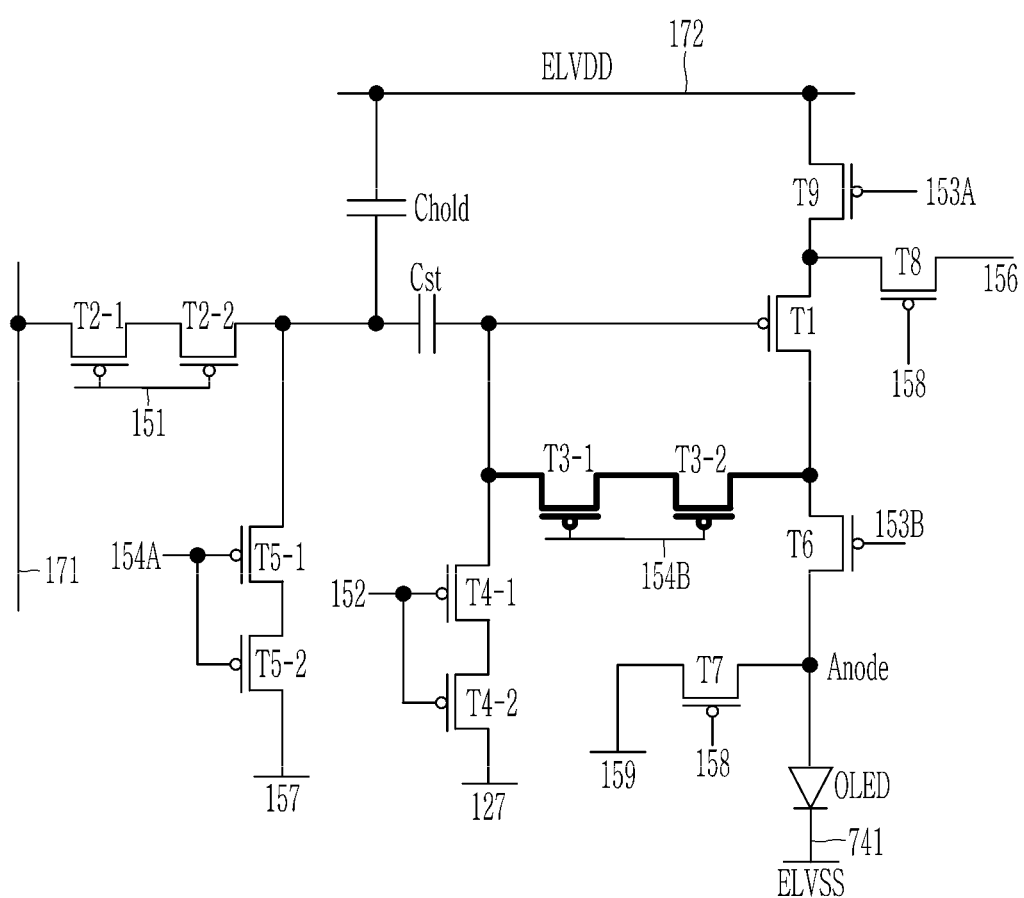

FIG. 32 is an equivalent circuit diagram of a pixel for another embodiment. The embodiment of FIG. 32 is the same as that of FIG. 29 except that the thicknesses of the semiconductor layer 130 of the (3-1)-th transistor T3-1 and the (3-2)-th transistor T3-2 are thinner than the thickness of the semiconductor layer 130 of the driving transistor T1. Detailed description of the same constituent elements will be omitted. In FIG. 32, the area of the thin thickness is illustrated by a thick line. Even when the thicknesses of the semiconductor layer 130 of the (3-1)-th transistor T3-1 and the (3-2)-th transistor T3-2 are reduced in this way, as described above, since the amount of leakage current flowing to the gate electrode of the driving transistor T1 through the (3-1)-th transistor T3-1 and the (3-2)-th transistor T3-2 may be reduced, the flicker may be prevented from being viewed during low frequency driving.

Figure 33:
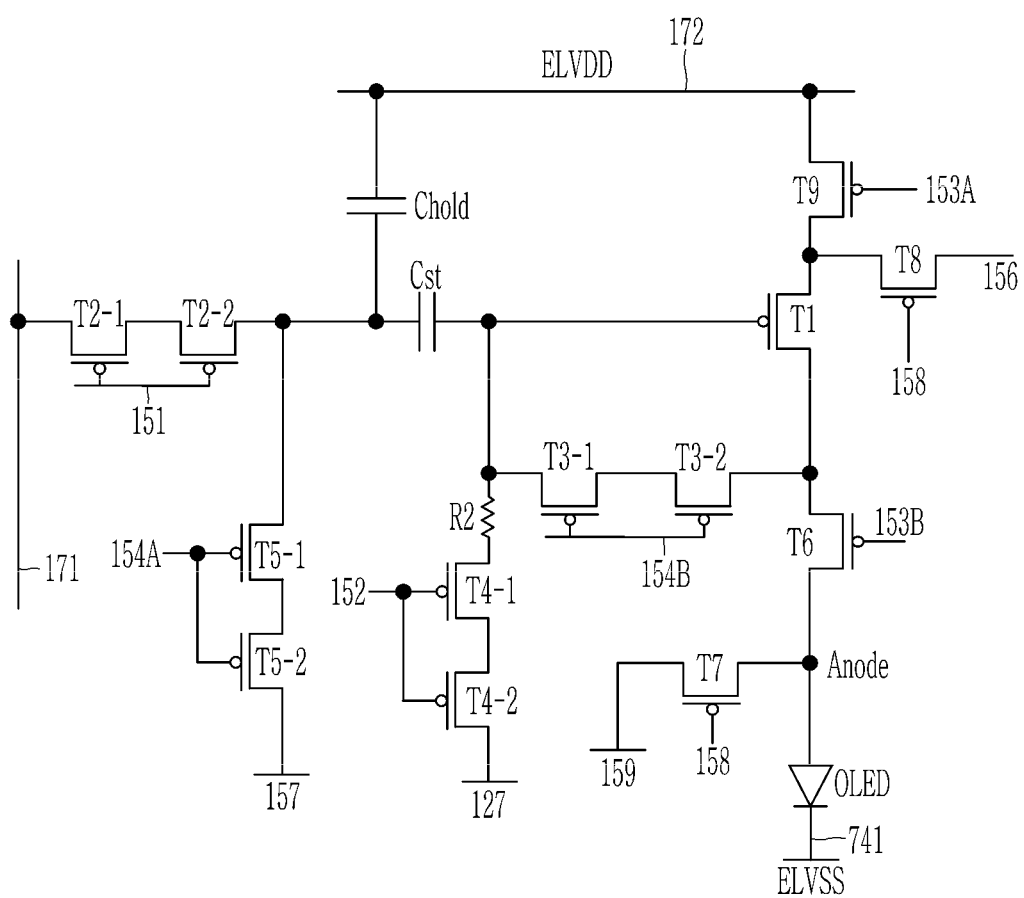

FIG. 33 illustrates an equivalent circuit diagram of a pixel for another embodiment. Referring to FIG. 33, the display device according to the present embodiment includes the second resistor R2 positioned between the fourth transistor T4 and the gate electrode of the driving transistor T1. As described above, the second resistor R2 means a thin portion of the semiconductor layer. The semiconductor layer with such a thin thickness may reduce the leakage current, and prevent the flicker from being viewed during low frequency driving.

Figure 34:
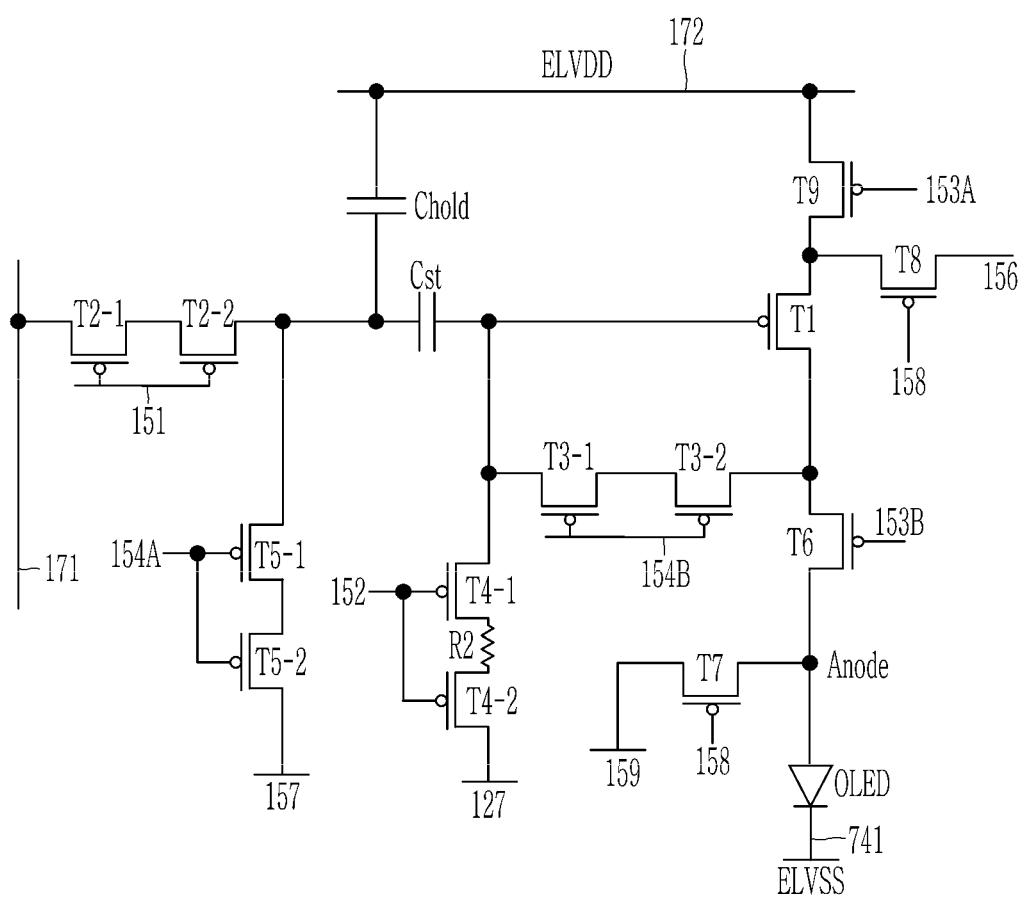

FIG. 34 is an equivalent circuit diagram of a pixel for another embodiment. Referring to FIG. 34, the display device according to the present embodiment is the same as that of FIG. 33 except that the second resistor R2 is positioned between the (4-1)-th transistor T4-1 and the (4-2)-th transistor T4-2. Detailed description of the same constituent elements will be omitted. As described above, the second resistor R2 means a thin portion of the semiconductor layer. FIG. 34 shows that the leakage current is reduced by the second resistor R2 positioned between the (4-1)-th transistor T4-1 and the (4-2)-th transistor T4-2 and the flicker is prevented from being viewed during low frequency driving.

Figure 35:
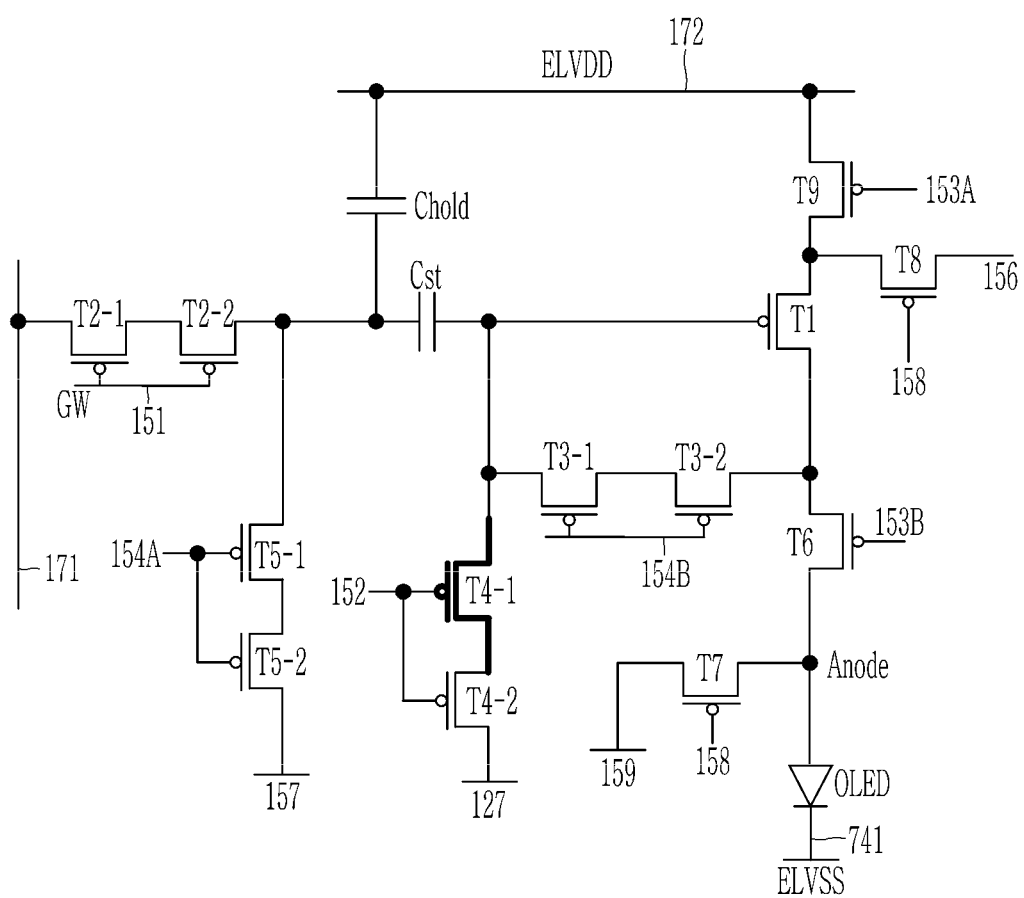

FIG. 35 is an equivalent circuit diagram of a pixel for another embodiment. Referring to FIG. 35, the display device according to the present embodiment is the same as that of FIG. 33 except that the thickness of the semiconductor layer 130 of the (4-1)-th transistor T4-1 is thinner than the thickness of the semiconductor layer 130 of the (4-2)-th transistor T4-2. Detailed description of the same constituent elements will be omitted. In FIG. 35, the area having the thin thickness of the semiconductor layer is illustrated by a thick line. Even when the thickness of the semiconductor layer 130 of the (4-1)-th transistor T4-1 is reduced in this way, as described above, since the amount of leakage current flowing to the gate electrode of the driving transistor T1 through the (4-1)-th transistor T4-1 may be reduced, the flicker may be prevented from being viewed during low frequency driving.

Figure 36:
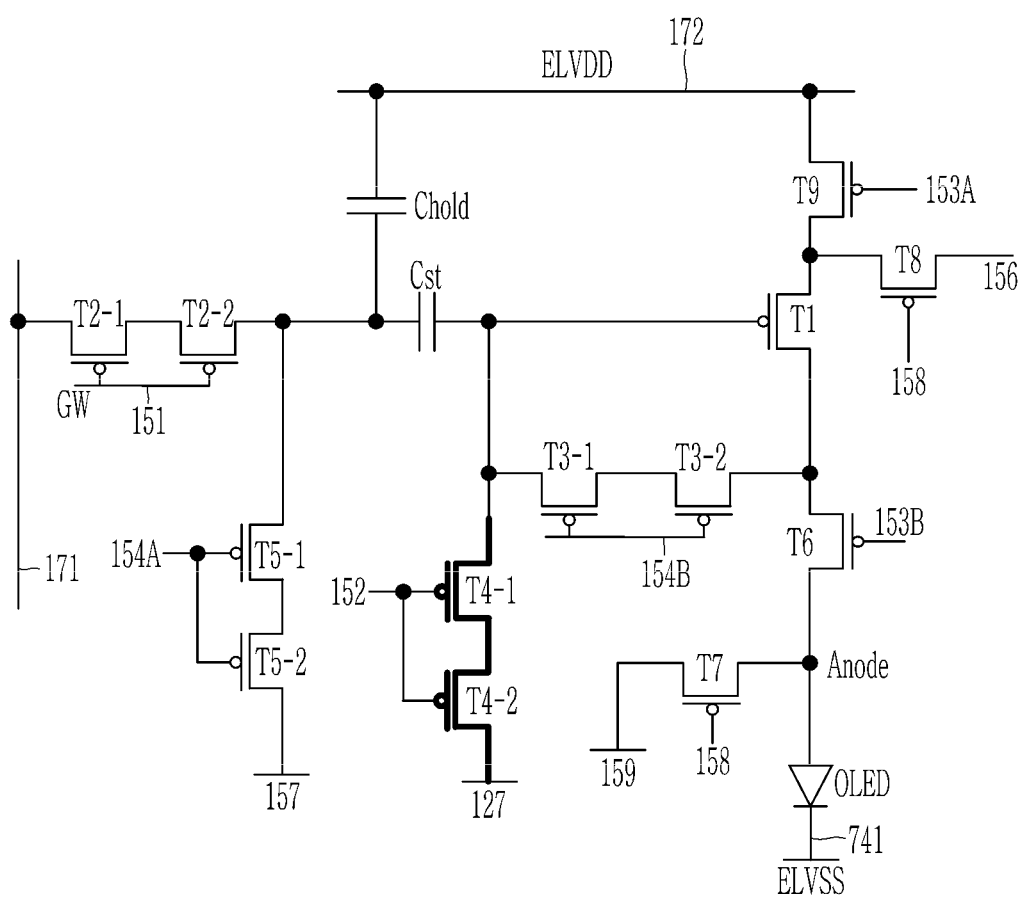

FIG. 36 illustrates an equivalent circuit diagram of a pixel for another embodiment. The embodiment of FIG. 36 is the same as that of FIG. 33 except that the thicknesses of the semiconductor layer 130 of the (4-1)-th transistor T4-1 and the (4-2)-th transistor T4-2 are thinner than the thickness of the semiconductor layer of the driving transistor T1. Detailed description of the same constituent elements will be omitted. In FIG. 36, the area of the thin thickness is illustrated by a thick line. Even when the thicknesses of the semiconductor layer 130 of the (4-1)-th transistor T4-1 and the (4-2)-th transistor T4-2 are reduced in this way, as described above, since the amount of leakage current flowing to the gate electrode of the driving transistor T1 through the (4-1)-th transistor T4-1 and the (4-2)-th transistor T4-2 may be reduced, the flicker may be prevented from being viewed during low frequency driving.

Figure 37:
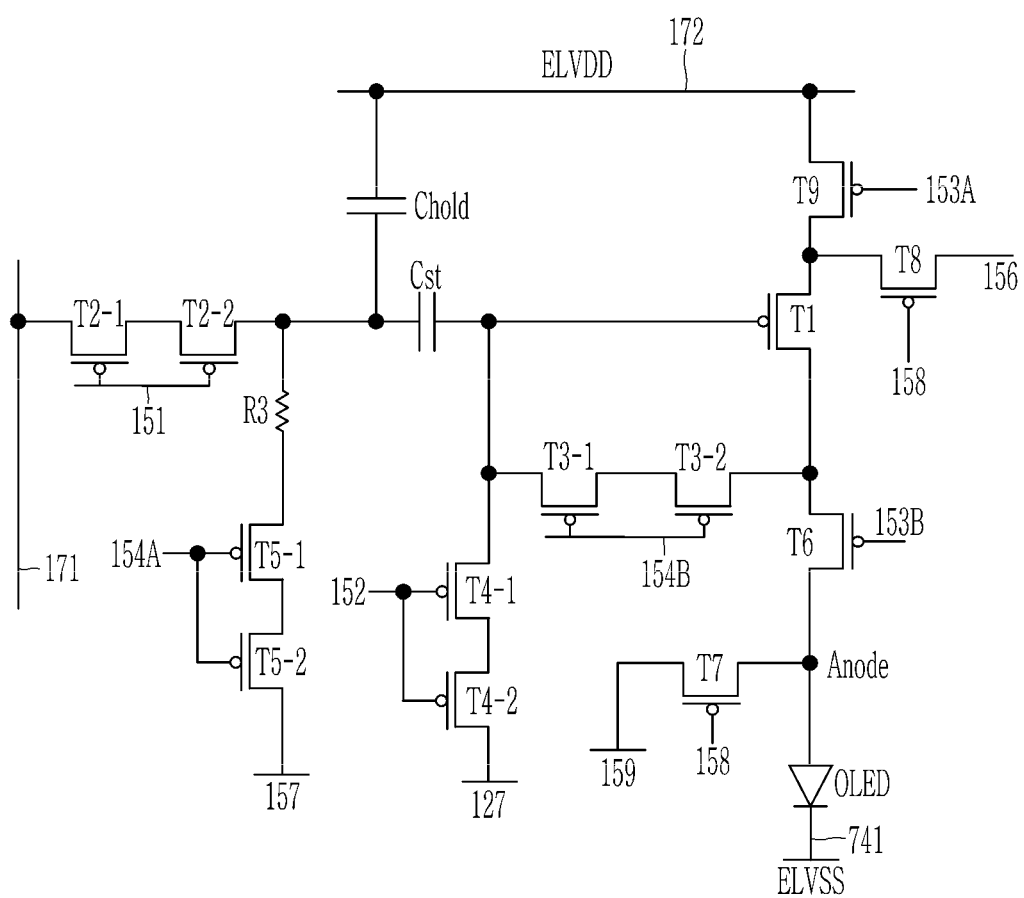

FIG. 37 illustrates an equivalent circuit diagram of a pixel for another embodiment. Referring to FIG. 37, the display device according to the present embodiment includes a third resistor R3 positioned between the fifth transistor T5 and the gate electrode of the driving transistor T1. As described above, the third resistor R3 means a thin portion of the semiconductor layer. The semiconductor layer with such a thin thickness may reduce the leakage current, and prevent the flicker from being viewed during low frequency driving.

Figure 38:
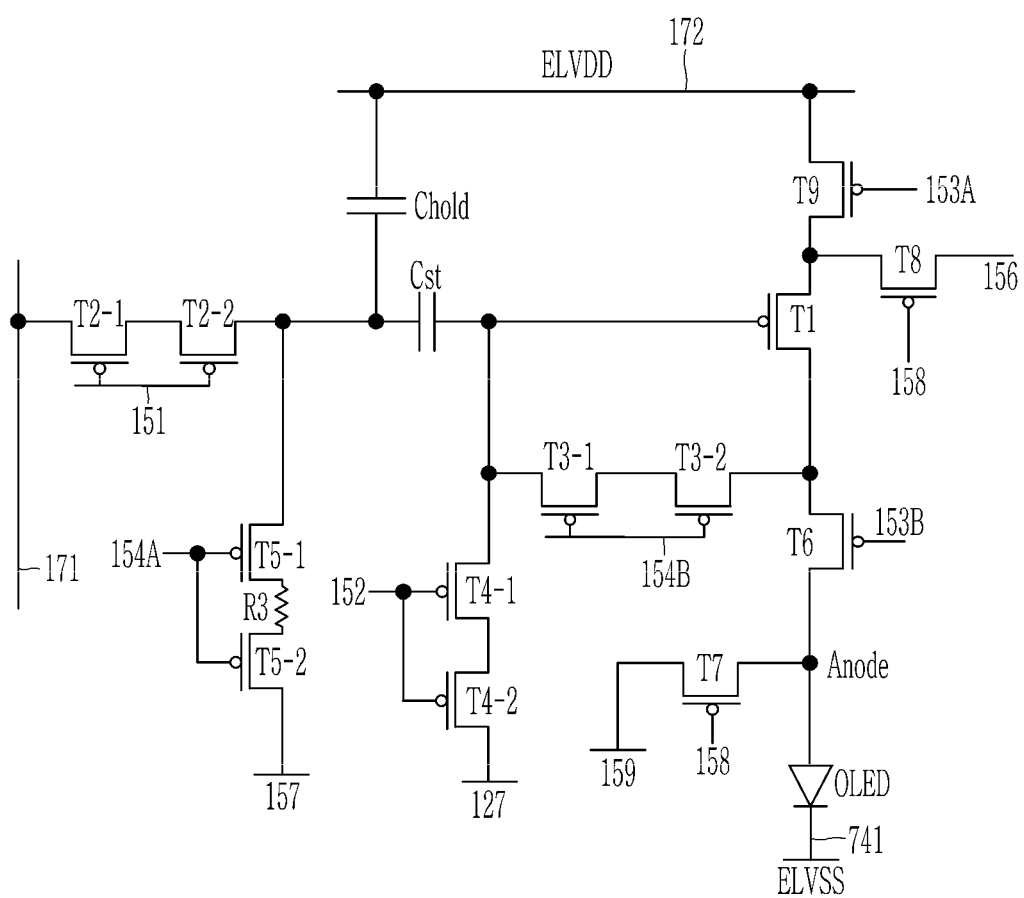

FIG. 38 illustrates an equivalent circuit diagram of a pixel for another embodiment. Referring to FIG. 38, the display device according to the present embodiment is the same as that of FIG. 37 except that the third resistor R3 is positioned between a (5-1)-th transistor T5-1 and a (5-2)-th transistor T5-2. Detailed description of the same constituent elements will be omitted. As described above, the third resistor R3 means a thin portion of the semiconductor layer. FIG. 38 shows that the leakage current is reduced by the third resistor R3 positioned between the (5-1)-th transistor T5-1 and the (5-2)-th transistor T5-2 and the flicker is prevented from being viewed during low-frequency driving.

Figure 39:
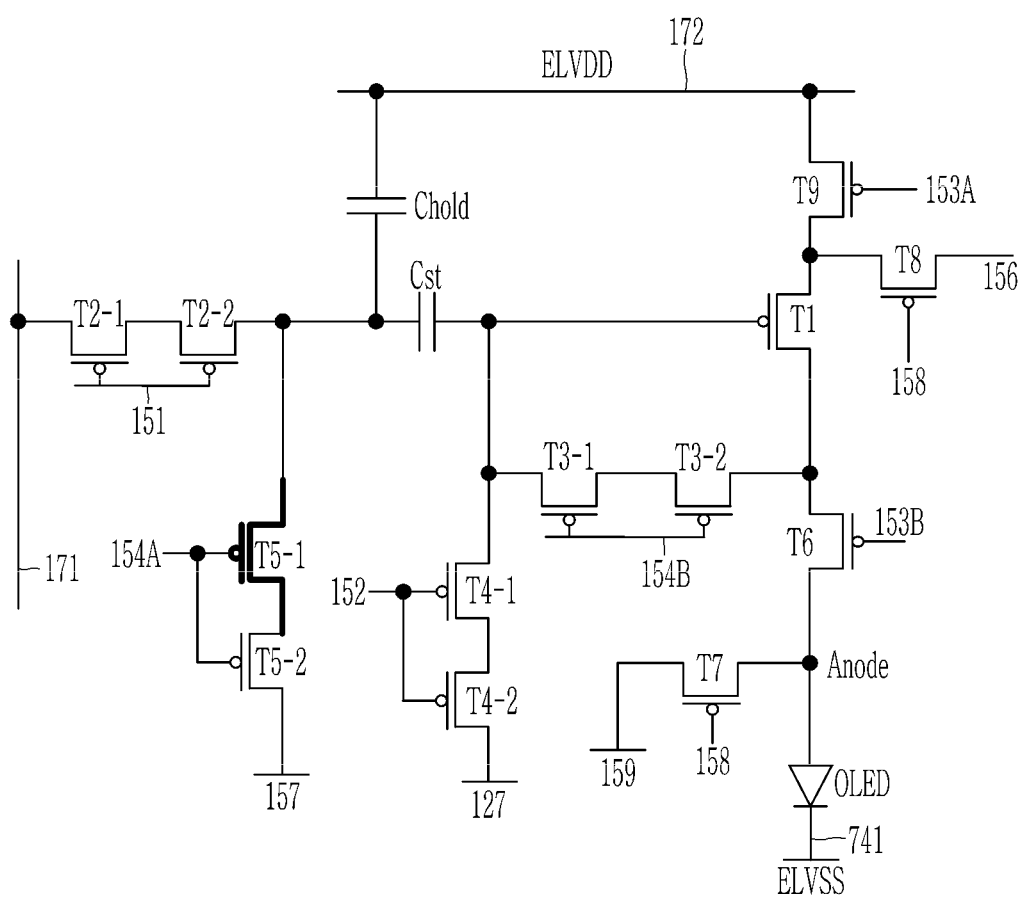

FIG. 39 is an equivalent circuit diagram of a pixel for another embodiment. Referring to FIG. 39, the display device according to the present embodiment is the same as that of FIG. 37 except that the thickness of the semiconductor layer 130 of the (5-1)-th transistor T5-1 is thinner than the thickness of the semiconductor layer 130 of the (5-2)-th transistor T5-2. Detailed description of the same constituent elements will be omitted. In FIG. 39, the area having the thin thickness of the semiconductor layer is illustrated by a thick line. Even when the thickness of the semiconductor layer 130 of the (5-1)-th transistor T5-1 is reduced in this way, as described above, since the amount of leakage current flowing to the gate electrode of the driving transistor T1 through the (5-1)-th transistor T5-1 may be reduced, the flicker may be prevented from being viewed during low frequency driving.

Figure 40:
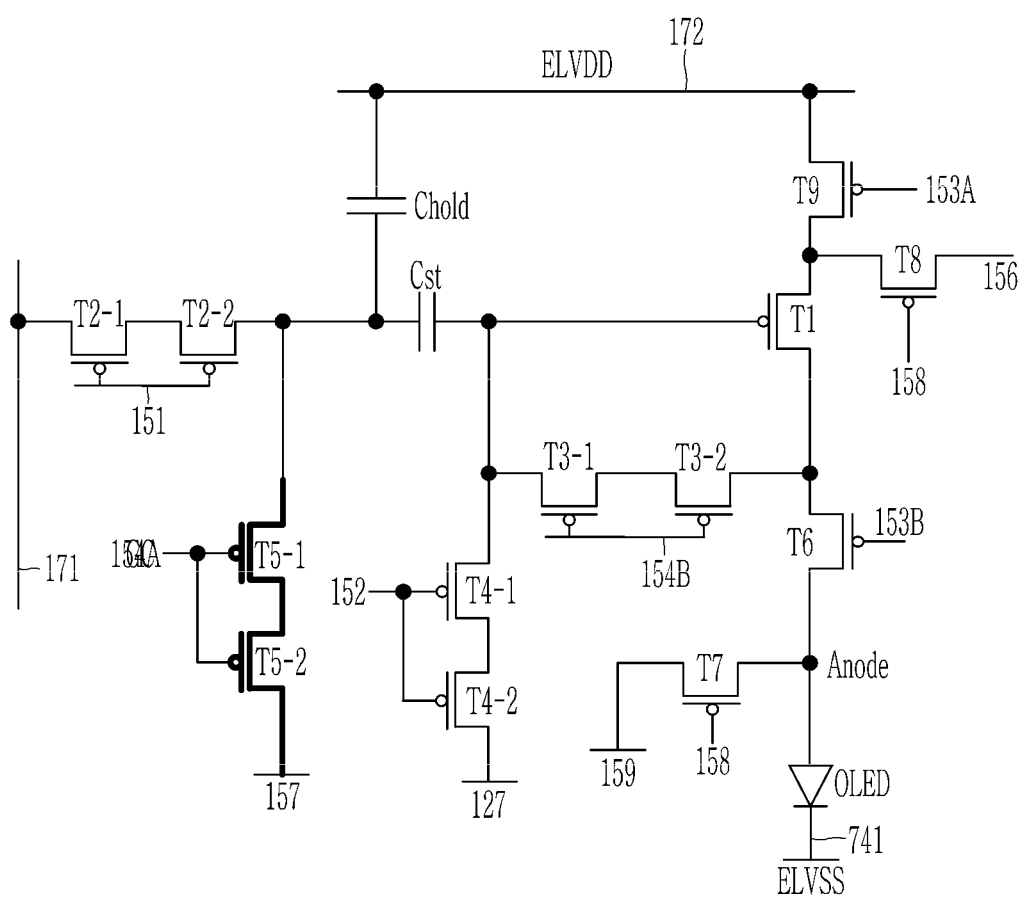

FIG. 40 illustrates an equivalent circuit diagram of a pixel for another embodiment. The embodiment of FIG. 40 is the same as that of FIG. 37 except that the thicknesses of the semiconductor layer 130 of the (5-1)-th transistor T5-1 and the (5-2)-th transistor T5-2 are thinner than the thickness of the semiconductor layer of the driving transistor T1. Detailed description of the same constituent elements will be omitted. In FIG. 40, the area of the thin thickness is illustrated by a thick line. Even when the thicknesses of the semiconductor layer 130 of the (5-1)-th transistor T5-1 and the (5-2)-th transistor T5-2 are reduced in this way, as described above, since the amount of leakage current flowing to the gate electrode of the driving transistor T1 through the (5-1)-th transistor T5-1 and the (5-2)-th transistor T5-2 may be reduced, the flicker may be prevented from being viewed during low frequency driving.

Figure 41:
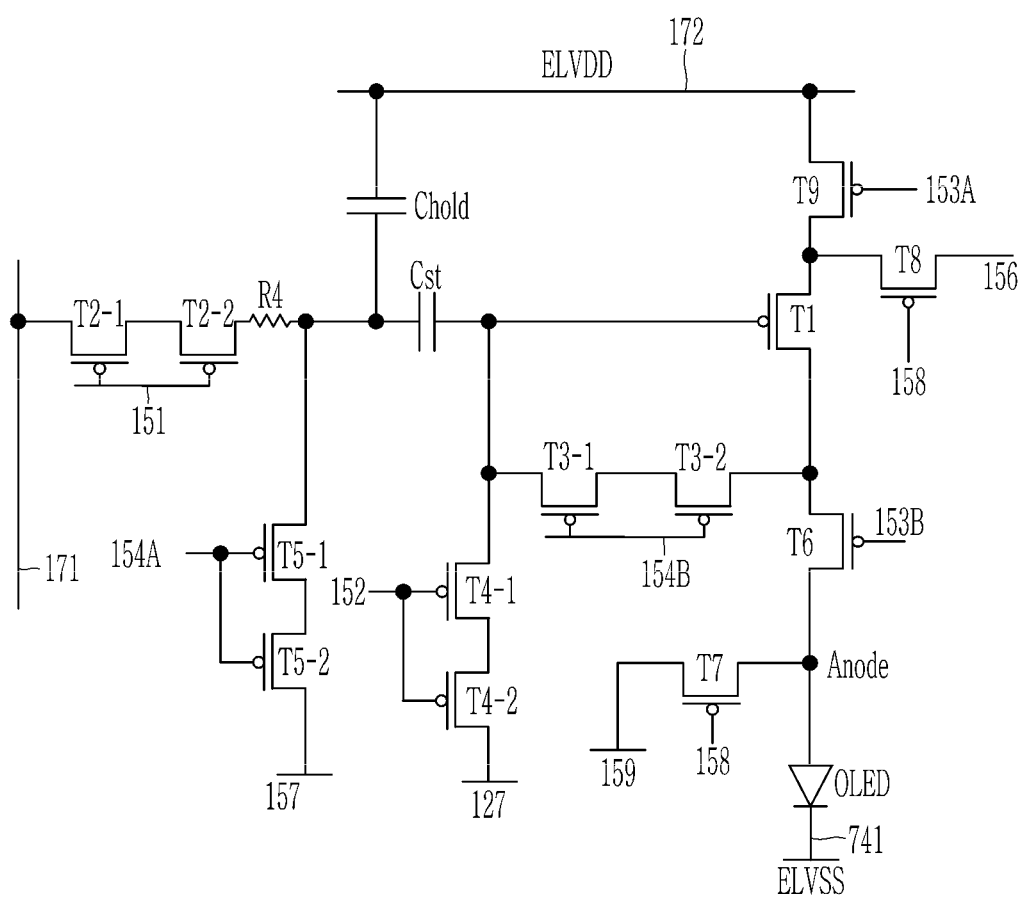

FIG. 41 illustrates an equivalent circuit diagram of a pixel for another embodiment. Referring to FIG. 41, the display device according to the present embodiment includes a fourth resistor R4 positioned between the second transistor T2 and the gate electrode of the driving transistor T1. As described above, the fourth resistor R4 means a thin portion of the semiconductor layer. The semiconductor layer with such a thin thickness may reduce the leakage current, and prevent the flicker from being viewed during low frequency driving.

Figure 42:
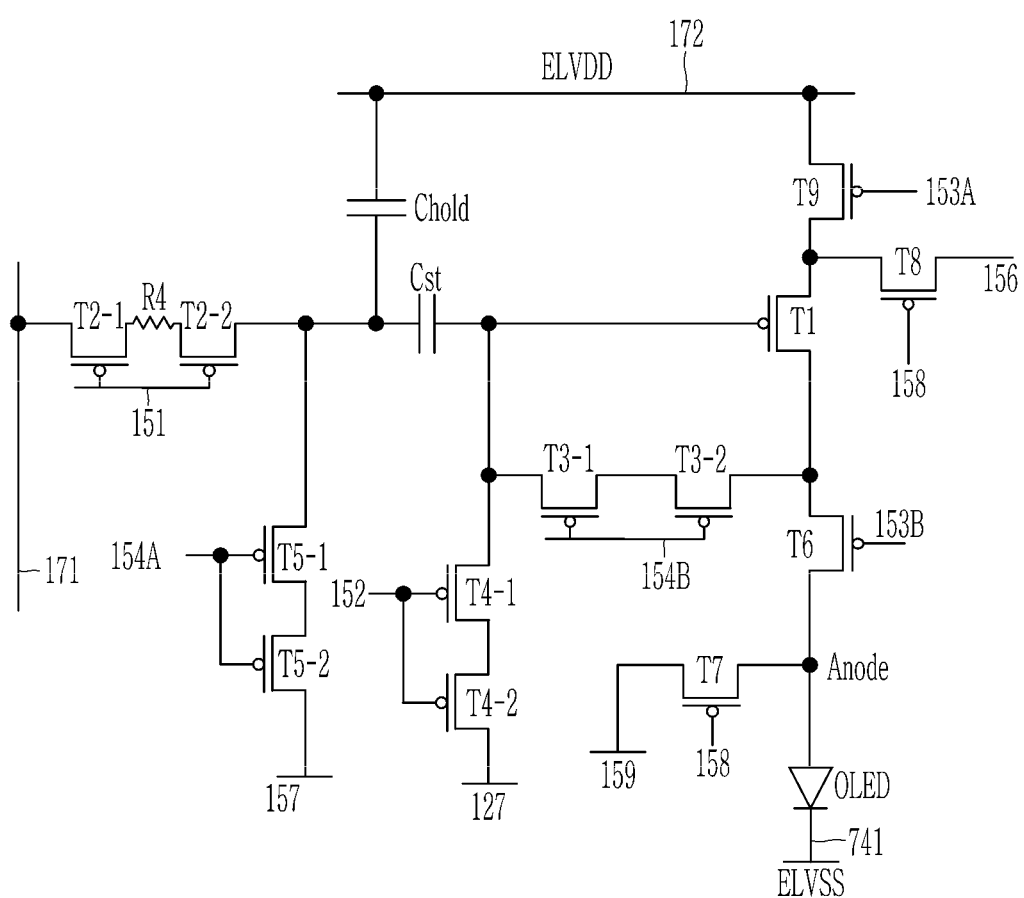

FIG. 42 is an equivalent circuit diagram of a pixel for another embodiment. Referring to FIG. 42, the display device according to the present embodiment is the same as that of FIG. 41 except that the fourth resistor R4 is positioned between the (2-1)-th transistor T2-1 and the (2-2)-th transistor T2-2. Detailed description of the same constituent elements will be omitted. As described above, the fourth resistor R4 means a thin portion of the semiconductor layer. FIG. 42 shows that the leakage current is reduced by the fourth resistor R2 positioned between the (2-1)-th transistor T2-1 and the (2-2)-th transistor T2-2 and the flicker is prevented from being viewed during low frequency driving.

Figure 43:
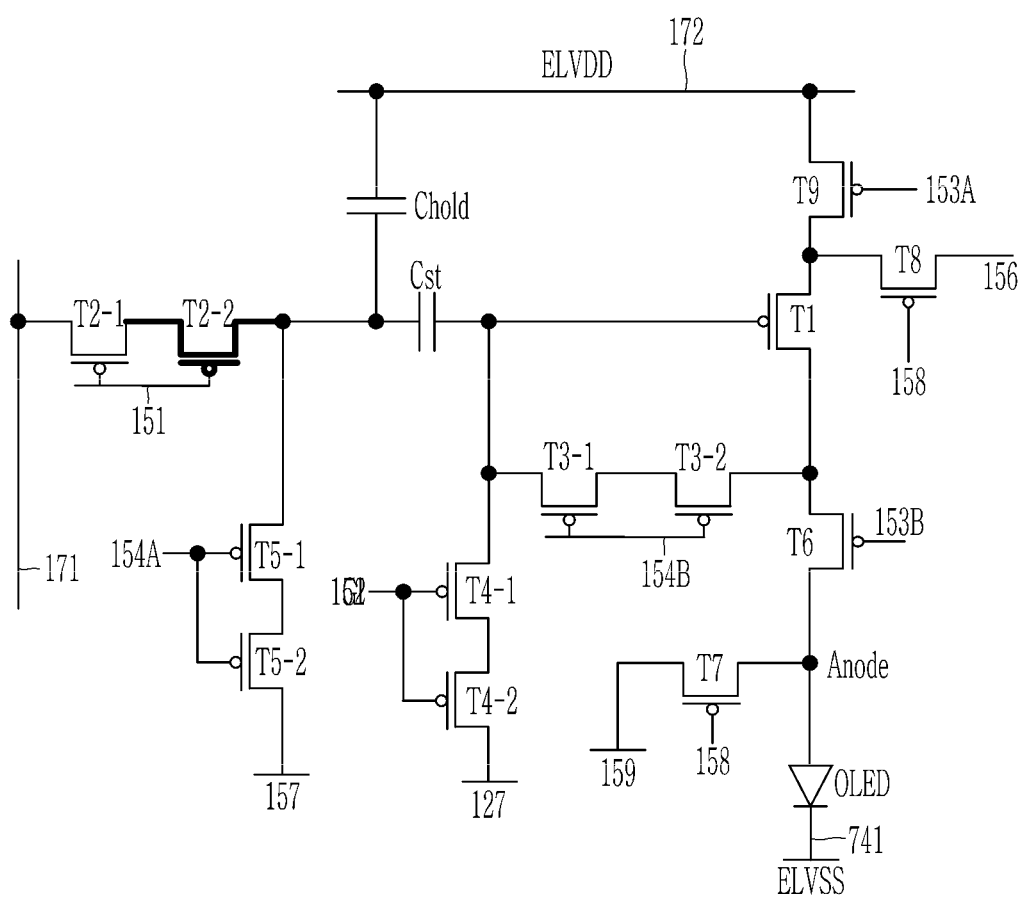

FIG. 43 illustrates an equivalent circuit diagram of a pixel for another embodiment. Referring to FIG. 43, the display device according to the present embodiment is the same as that of FIG. 41 except that the thickness of the semiconductor layer 130 of the (2-2)-th transistor T2-2 is thinner than the thickness of the semiconductor layer 130 of the (2-1)-th transistor T2-1. Detailed description of the same constituent elements will be omitted. In FIG. 43, the area having the thin thickness of the semiconductor layer is illustrated by a thick line. Even when the thickness of the semiconductor layer 130 of the (2-2)-th transistor T2-2 is reduced in this way, as described above, since the amount of leakage current flowing to the gate electrode of the driving transistor T1 through the (2-2)-th transistor T2-2 may be reduced, the flicker may be prevented from being viewed during low frequency driving.

Figure 44:
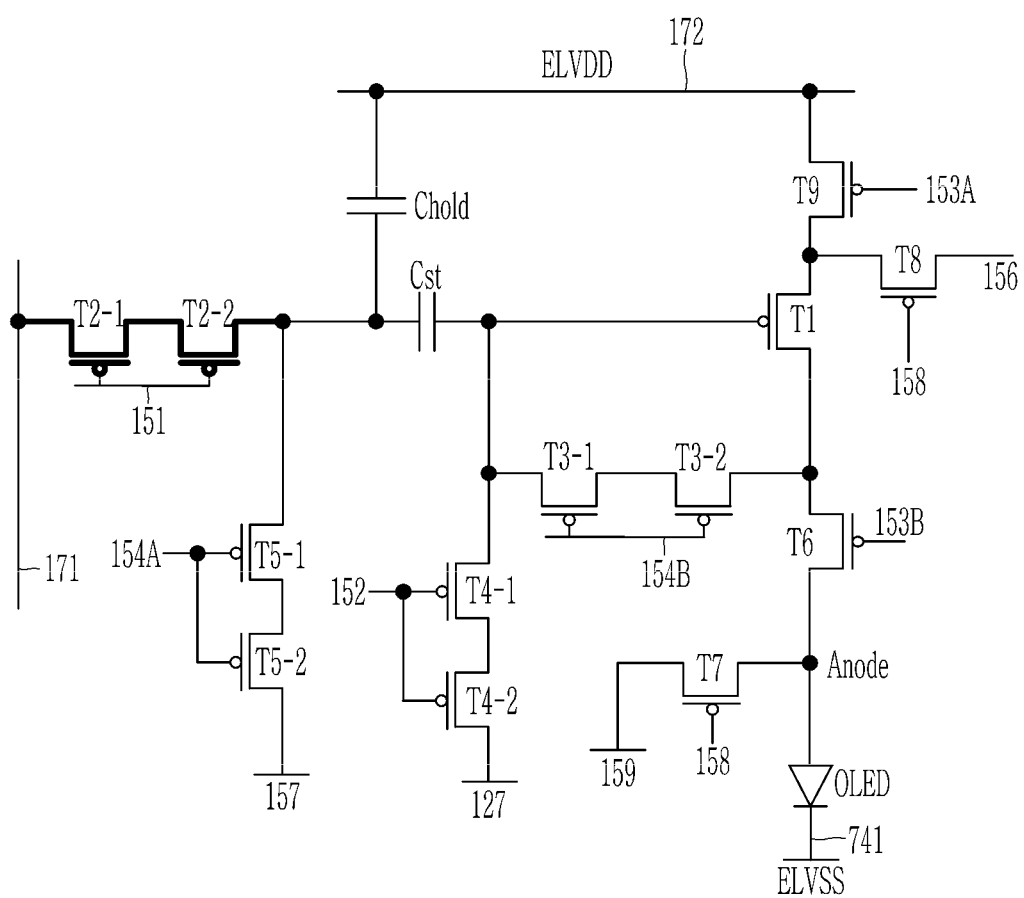

FIG. 44 is an equivalent circuit diagram of a pixel for another embodiment. The embodiment of FIG. 44 is the same as that of FIG. 41 except that the thicknesses of the semiconductor layer 130 of the (2-1)-th transistor T2-1 and the (2-2)-th transistor T2-2 are thinner than the thickness of the semiconductor layer of the driving transistor T1. Detailed description of the same constituent elements will be omitted. In FIG. 44, the area of the thin thickness is illustrated by a thick line. Even when the thicknesses of the semiconductor layer 130 of the (2-1)-th transistor T2-1 and the (2-2)-th transistor T2-2 are reduced in this way, as described above, since the amount of leakage current flowing to the gate electrode of the driving transistor T1 through the (2-1)-th transistor T2-1 and the (2-2)-th transistor T2-2 may be reduced, the flicker may be prevented from being viewed during low frequency driving.

While this inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
a substrate; and
a plurality of transistors disposed on the substrate, each of the plurality of transistors including:
a semiconductor layer disposed on the substrate,
a gate electrode disposed on the semiconductor layer; and
a light emitting element disposed on the plurality of transistors,
wherein the plurality of transistors include a driving transistor that transmits a driving voltage to the light emitting element and a compensation transistor that is turned on in response to a scan signal,
wherein the semiconductor layer includes a first portion having a first thickness and a second portion having a second thickness thinner than the first thickness, the first portion and the second portion being formed of the same material,
wherein a channel, a source and a drain of the driving transistor are disposed in the first portion of the semiconductor layer,
wherein a channel of at least one of the plurality of transistors other than the driving transistor is disposed in the second portion of the semiconductor layer, and
wherein the semiconductor layer is doped with a dopant of a same conductivity type.

2. The display device of claim 1, wherein a thickness of the first portion is 400 Å to 500 Å.

3. The display device of claim 1, wherein a thickness of the second portion is 300 Å to 400 Å.

4. The display device of claim 1, wherein the thickness of the second portion is 60% to 90% of the thickness of the first portion.

5. The display device of claim 1,
wherein:
a first electrode of the compensation transistor is connected to a first electrode of the driving transistor;
a second electrode of the compensation transistor is connected to a gate electrode of the driving transistor; and
the second portion of the semiconductor layer is disposed between the second electrode of the compensation transistor and the first electrode of the compensation transistor.

6. The display device of claim 1, wherein:
the compensation transistor includes a (3-1)-th transistor and a (3-2)-th transistor serially connected to each other; and
the second portion of the semiconductor layer is disposed between the (3-1)-th transistor and the (3-2)-th transistor.

7. The display device of claim 1, wherein:
the compensation transistor includes a (3-1)-th transistor and a (3-2)-th transistor serially connected to each other;
the (3-2)-th transistor includes the first portion of the semiconductor layer; and
the (3-1)-th transistor includes the second portion of the semiconductor layer.

8. The display device of claim 1, wherein the compensation transistor includes the second portion of the semiconductor layer.

9. The display device of claim 1, wherein:
the plurality of transistors further include a fourth transistor that transmits an initializing voltage to a gate of the driving transistor;

a first electrode of the fourth transistor is connected to an initializing voltage line; and
a second electrode of the fourth transistor is connected to the gate electrode of the driving transistor.

10. The display device of claim 9, wherein the second portion of the semiconductor layer is disposed between the second electrode of the fourth transistor and the gate electrode of the driving transistor.

11. The display device of claim 9, wherein:
the fourth transistor includes a (4-1)-th transistor and a (4-2)-th transistor serially connected to each other; and
the second portion of the semiconductor layer is disposed between the (4-1)-th transistor and the (4-2)-th transistor.

12. The display device of claim 9, wherein:
the fourth transistor includes a (4-1)-th transistor and a (4-2)-th transistor serially connected to each other;
the (4-2)-th transistor includes the first portion of the semiconductor layer; and
the (4-1)-th transistor includes the second portion of the semiconductor layer.

13. The display device of claim 9, wherein the fourth transistor includes the second portion of the semiconductor layer.

14. The display device of claim 1, wherein the display device includes seven transistors and one capacitor.

15. The display device of claim 1, wherein the display device includes nine transistors and two capacitors.

16. The display device of claim 15, wherein:
one of the two capacitors is a storage capacitor;
the gate electrode of the driving transistor is connected to a second electrode of the storage capacitor; and
a first electrode of the storage capacitor is connected to a second transistor through which a data voltage is applied and a fifth transistor through which a reference voltage is applied.

17. The display device of claim 16, wherein the second portion of the semiconductor layer is disposed between a second electrode of the fifth transistor and the first electrode of the storage capacitor.

18. The display device of claim 16, wherein:
the fifth transistor includes a (5-1)-th transistor and a (5-2)-th transistor serially connected to each other; and
the second portion of the semiconductor layer is disposed between the (5-1)-th transistor and the (5-2)-th transistor.

19. The display device of claim 16, wherein:
the fifth transistor includes a (5-1)-th transistor and a (5-2)-th transistor serially connected to each other;
the (5-2)-th transistor includes the first portion of the semiconductor layer; and
the (5-1)-th transistor includes the second portion of the semiconductor layer.

20. The display device of claim 16, wherein the fifth transistor includes the second portion of the semiconductor layer.

21. The display device of claim 16, wherein the second portion of the semiconductor layer is disposed between a second electrode of the second transistor and the first electrode of the storage capacitor.

22. The display device of claim 16, wherein:
the second transistor includes a (2-1)-th transistor and a (2-2)-th transistor serially connected to each other; and
the second portion of the semiconductor layer is disposed between the (2-1)-th transistor and the (2-2)-th transistor.

23. The display device of claim 16, wherein:
the fifth transistor includes a (2-1)-th transistor and a (2-2)-th transistor serially connected to each other;
the (2-1)-th transistor includes the first portion of the semiconductor layer; and
the (2-2)-th transistor includes the second portion of the semiconductor layer.

24. The display device of claim 16, wherein the second transistor is disposed in the second portion of the semiconductor layer.

25. The display device of claim 1, wherein the semiconductor layer is a polycrystalline semiconductor layer.

26. The display device of claim 1, wherein the display device is driven even at a low frequency of less than 60 Hz.

27. A manufacturing method of a display device, comprising:
forming an amorphous silicon layer on a substrate;
crystallizing the amorphous silicon layer to form a polycrystalline silicon layer;
doping the polycrystalline silicon layer with a dopant of a same conductivity type to form a polycrystalline semiconductor layer;
forming a photoresist in a partial area of the polycrystalline semiconductor layer to cover a channel area, a source area and a drain area of a driving transistor and to expose at least a channel area of a transistor other than the driving transistor; and
etching the polycrystalline semiconductor layer exposed by the photoresist to form a first portion having a first thickness and a second portion having a second thickness thinner than the first thickness.

28. The manufacturing method of the display device of claim 27, wherein:
the first portion is an area overlapping the photoresist; and
the second portion is an area that does not overlap the photoresist.

29. The manufacturing method of the display device of claim 27, wherein a thickness of the first portion is 400 Å to 500 Å.

30. The manufacturing method of the display device of claim 27, wherein a thickness of the second portion is 300 Å to 400 Å.

31. The manufacturing method of the display device of claim 27, wherein, in the etching of the polycrystalline semiconductor layer on which the photoresist is disposed, an etched thickness is 10% to 40% of an entire thickness of the polycrystalline semiconductor layer.

32. The manufacturing method of the display device of claim 27, wherein:
the polycrystalline semiconductor layer constitutes an active layer of each of the driving transistor and the transistor other than the driving transistor; and
the driving transistor includes the first portion.

* * * * *